(12) United States Patent
Egami et al.

(10) Patent No.: US 9,317,055 B2
(45) Date of Patent: Apr. 19, 2016

(54) METHOD FOR SEQUENTIALLY MEASURING IMPEDANCE, MEASUREMENT DEVICE, AND FUEL CELL SYSTEM

(71) Applicant: HONDA MOTOR CO., LTD., Tokyo (JP)

(72) Inventors: Masahiro Egami, Saitama (JP); Hiromichi Yoshida, Saitama (JP); Chihiro Wake, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 783 days.

(21) Appl. No.: 13/659,090

(22) Filed: Oct. 24, 2012

(65) Prior Publication Data

US 2013/0103224 A1    Apr. 25, 2013

(30) Foreign Application Priority Data

Oct. 24, 2011    (JP) .................... 2011-232832

(51) Int. Cl.
*G05B 21/00*    (2006.01)
*G05F 1/66*    (2006.01)
(Continued)

(52) U.S. Cl.
CPC .............. *G05F 1/66* (2013.01); *H01M 8/04552* (2013.01); *H01M 8/04582* (2013.01);
(Continued)

(58) Field of Classification Search
CPC .. G01R 31/3651; G01R 31/3662; G05F 1/66; H01M 2250/20; H01M 8/04552; H01M 8/04582; H01M 8/04641; Y02E 60/50; Y02T 90/32
USPC .......................................................... 700/297
See application file for complete search history.

(56) References Cited

U.S. PATENT DOCUMENTS

2004/0158418 A1*  8/2004  Kato .................... G01R 31/362
                                                        702/63
2007/0257681 A1* 11/2007  Christophersen .. G01R 31/3651
                                                        324/426
(Continued)

FOREIGN PATENT DOCUMENTS

JP        59-230170 A     12/1984
JP        11-160281 A      6/1999
(Continued)

OTHER PUBLICATIONS

Kiyohiko Toyoda, et al., "A Method of Measuring Impedance Fast Using FFT," The science reports of Faculty of Agriculture, Kobe University, 21, pp. 87-92, 1994.
(Continued)

*Primary Examiner* — Mohammad Ali
*Assistant Examiner* — Yuhui R Pan
(74) *Attorney, Agent, or Firm* — Squire Patton Boggs (US) LLP

(57) ABSTRACT

Provided are a sequential impedance measurement device and a method for sequentially measuring impedance. While applying a signal having a power output fluctuation similar to that of normal operation, it is possible to carry out a quick measurement with relatively high precision and in a broad frequency range. Also, the device and the method can simultaneously determine phenomena which occur in different frequency ranges. Disclosed is a sequential impedance measurement device in which impedance of a fuel cell is sequentially measured in a control system, the control system controlling the fuel cell by using a power indication value of a control processor, the device including: an M-sequence-signal-generating section; a superimposed-signal-generating section; a signal-processing section; a signal-adding unit; a current and voltage measuring unit; and an impedance calculator, wherein a method for controlling the fuel cell by the control processor is modified according to a calculation result of the impedance calculator.

14 Claims, 17 Drawing Sheets

(51) Int. Cl.
*H01M 8/04* (2006.01)
*G01R 31/36* (2006.01)

(52) U.S. Cl.
CPC ...... *H01M 8/04641* (2013.01); *G01R 31/3651* (2013.01); *G01R 31/3662* (2013.01); *H01M 2250/20* (2013.01); *Y02E 60/50* (2013.01); *Y02T 90/32* (2013.01)

(56) References Cited

U.S. PATENT DOCUMENTS

2011/0231124 A1* 9/2011 Itabashi .............. G01R 31/3651
702/63
2011/0300461 A1* 12/2011 Manabe ............ H01M 8/04649
429/428

FOREIGN PATENT DOCUMENTS

| JP | 2004-241325 A | 8/2004 |
| JP | 2005-285614 A | 10/2005 |
| JP | 2007-012418 A | 1/2007 |
| JP | 2008-016275 A | 1/2008 |
| JP | 2010-267472 A | 11/2010 |
| WO | 2007/054700 A1 | 5/2007 |

OTHER PUBLICATIONS

Toshiaki Konomi, et al., "Research on Diagnosis Technique on PEFC Running Condition (High Speed Analysis by FFT and Feasibility Study of Diagnosis)," Transactions of the Japan Society of Mechanical Engineers (B), vol. 71, 701, Jan. 2005, pp. 245-250.

Toshiaki Konomi, et al., Research of Diagnosis Technique on PEFC Running Condition (Over Voltage Analysis and Diagnosis of PEFC by FFT), Transactions of the Japan Society of Mechanical Engineers (B), vol. 72, 714, Feb. 2006, pp. 239-246.

M.A. Rubio et al., "Electrochemical Parameter Estimation in Operating Proton Exchange Membrane Fuel Cells", Journal of Power Sources, 2008, pp. 118-125.

Yee-Pien Yang et al., "Low Power Proton Exchange Membrane Fuel Cell System Identification and Adaptive Control", ScienceDirect, 2007, pp. 761-771.

German Office Action application No. 10 2012 219 425.8 issued Aug. 21, 2013.

Japanese Decision of a Patent Grant dated Jun. 21, 2013, with full English language translation.

* cited by examiner

FIG. 5A
EXAMPLE OF M-SEQUENCE:
[-1 -1 -1 -1 -1 -1 -1 -1 -1 1 1 1 -1 -1 1 1 -1 -1 -1 -1 -1 -1 -1 ......]
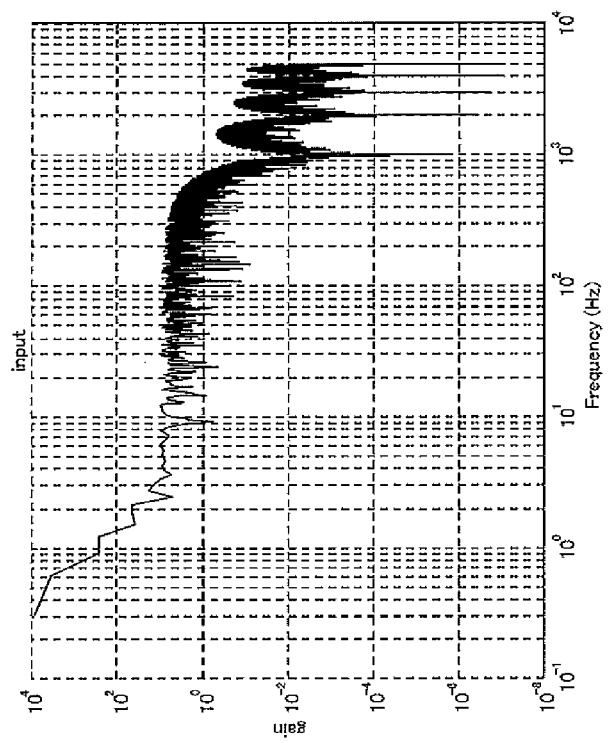
FIG. 5C
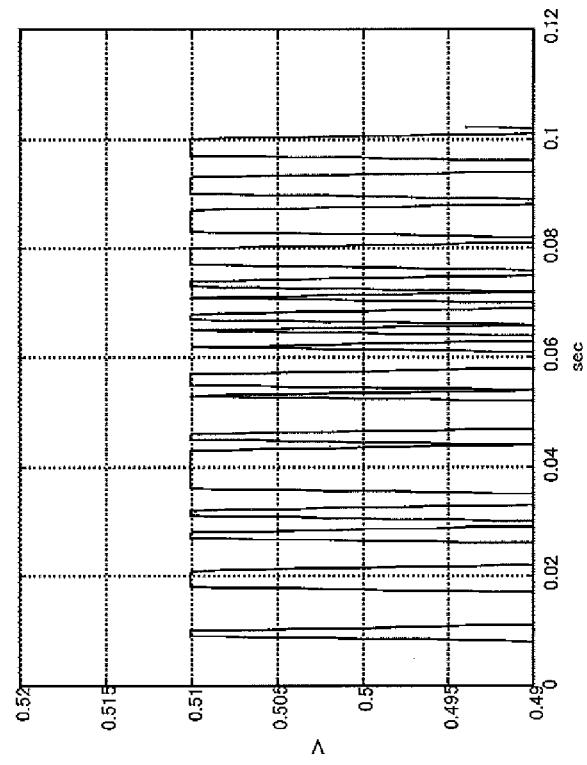
FIG. 5B

FOR HIGH-FREQUENCY RANGE
(SHORT CALCULATION INTERVAL)

FOR LOW-FREQUENCY RANGE
(LONG CALCULATION INTERVAL)

FOR ALL FREQUENCY RANGES
(CALCULATION INTERVAL IS INTERVAL
FOR LOW-FREQUENCY RANGE + $\alpha$)

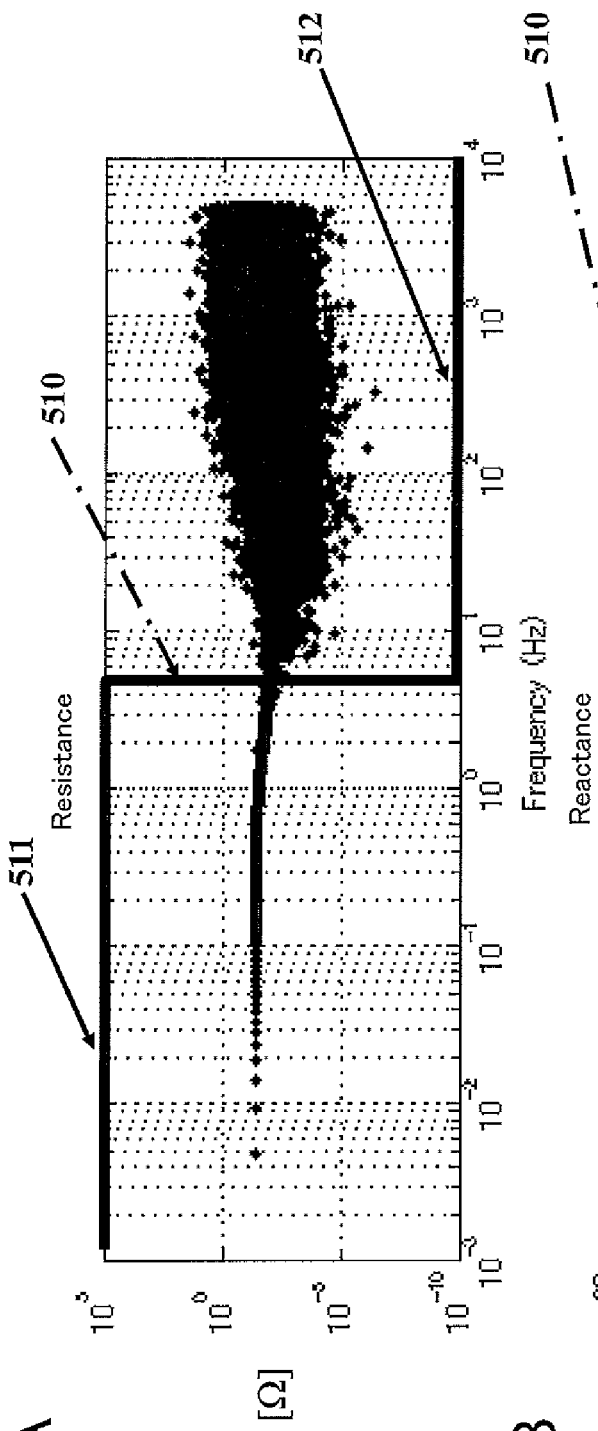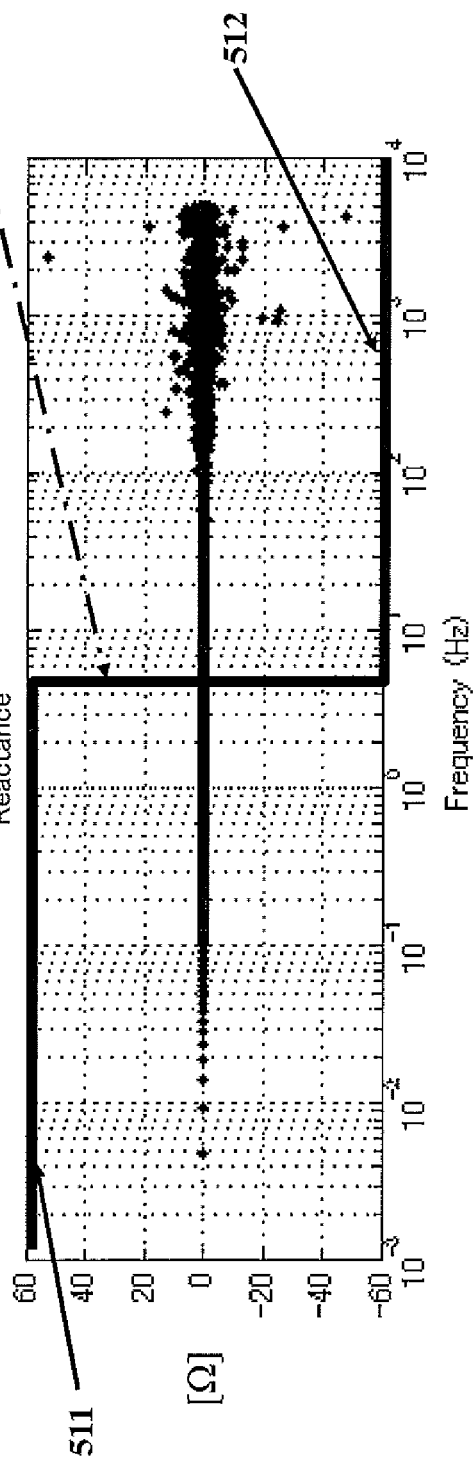
FIG. 11A
FIG. 11B

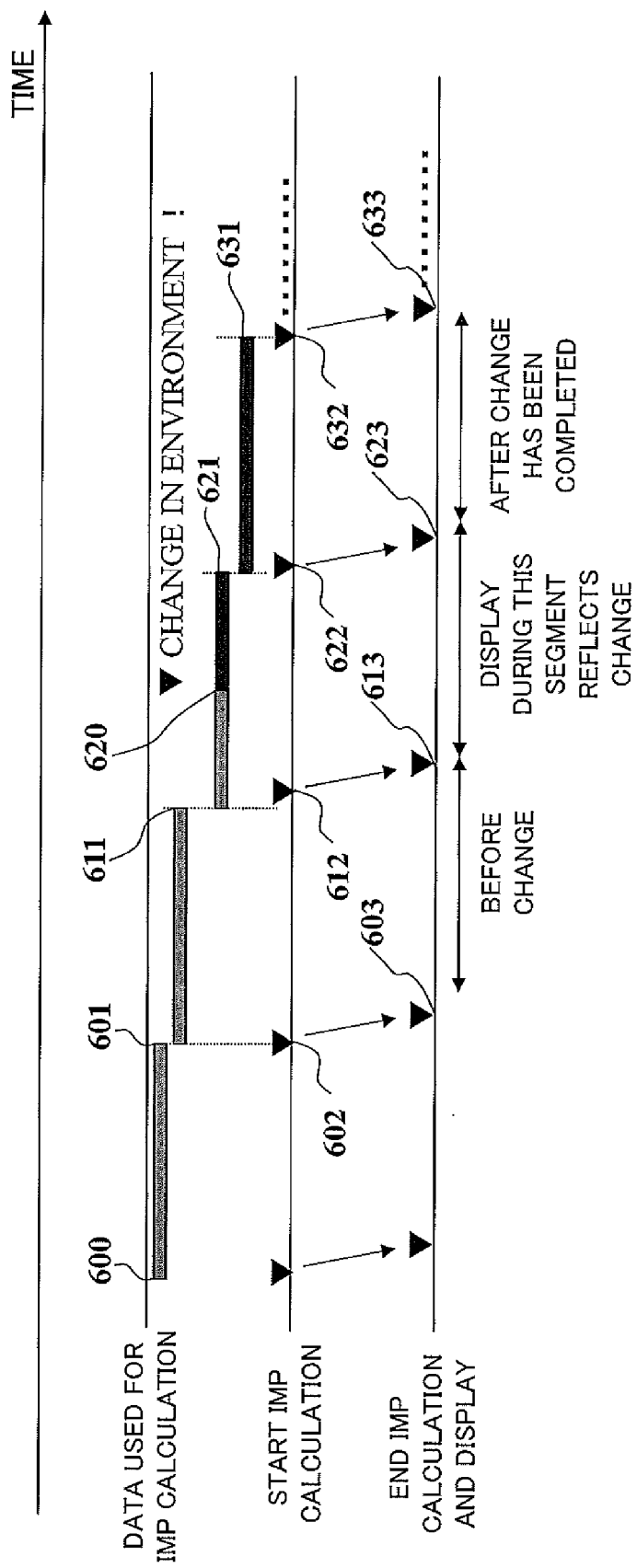

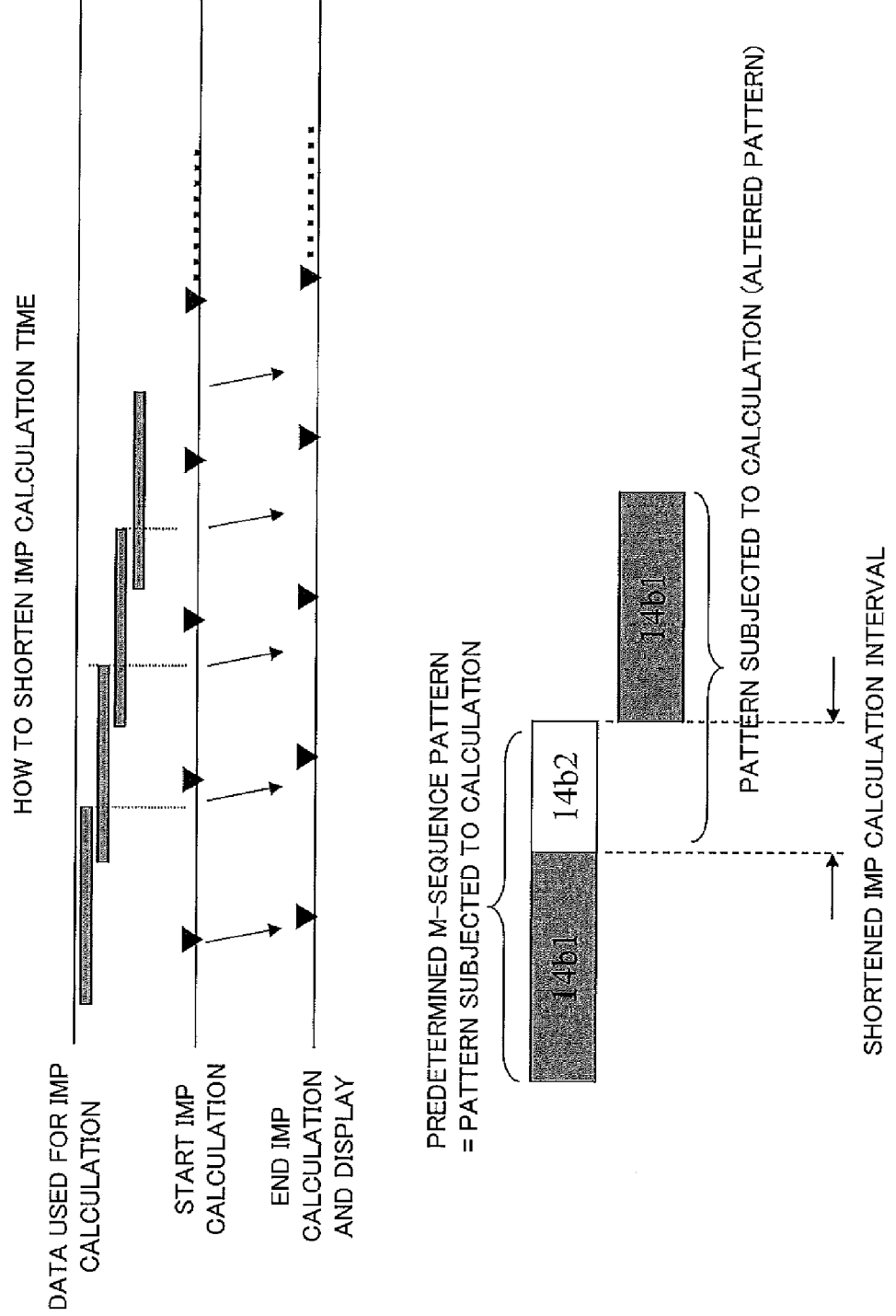

METHOD FOR SEQUENTIALLY MEASURING IMPEDANCE, MEASUREMENT DEVICE, AND FUEL CELL SYSTEM

BACKGROUND OF THE INVENTION

1. Field of the Invention

The present invention relates to methods for sequentially measuring impedance of a fuel cell, measurement devices, and fuel cell systems.

2. Description of the Related Art

Recently, fuel cell electric vehicles (FCEV) have drawn attention to promote environmental programs and to decrease fossil fuel consumption.

The fuel cell electric vehicle (hereinafter, referred to as a "vehicle" or "fuel cell vehicle") includes a fuel cell whose impedance characteristic is a critical element for vehicle driving performance and should be sequentially determined.

The fuel cell, however, has different impedance values because of different power generation conditions (e.g., a temperature, pressure, relative humidity) and/or driving conditions (e.g., a stoppage, start, high speed driving, high altitude driving, hill climbing). In addition, even under constant power generation conditions and/or driving conditions, the impedance exhibits different values depending on different frequencies. Fuel cell's electrolyte membrane resistance and other parameters are measured at a high-frequency range. How easily a chemical reaction proceeds and other aspects are observed at a medium-frequency range. A phenomenon occurring during diffusion of fuel and/or oxygen, what is called a concentration overvoltage, is observed at a low-frequency range. Thus, when flooding (retained-water-mediated blockage of a gas passage) occurs, the concentration overvoltage increases. In view of the above, a reaction in a fuel cell is a multi-scale reaction regarding time and frequency aspects. Its impedance has different frequency characteristics, which should be determined as a frequency characteristic at a predetermined frequency range. Because of this, a simultaneous measurement of the impedance is desirably performed at a broad frequency range.

Examples of a known conventional method for measuring impedance of a fuel cell include a FRA (Frequency Response Analyzer) method including: applying a sinusoidal wave at a predetermined frequency for measurement; and repeatedly conducting the measurement while changing the frequency (Patent Literatures 1 to 3).

In addition, examples of the impedance measurement other than the FRA method include a method for using a FFT (Fast Fourier Transform) after inputting an artificial white signal. For example, Non-Patent Documents 1 to 3 employ a technique for identification using a synthesized signal containing a sinusoidal wave.

PRIOR ART REFERENCE

Patent Literatures

[Patent Literature 1] JP2005-285614A
[Patent Literature 2] JP2008-16275A
[Patent Literature 3] JP2010-267472A

Non-Patent Documents

[Non-Patent Document 1] The science reports of Faculty of Agriculture, Kobe University, 21: 87-91, 1994.

[Non-Patent Document 2] TRANSACTIONS OF THE JAPAN SOCIETY OF MECHANICAL ENGINEERS (B), Vol. 71, 701 (2005-1).

[Non-Patent Document 3] TRANSACTIONS OF THE JAPAN SOCIETY OF MECHANICAL ENGINEERS (B), Vol. 72, 714 (2006-1).

SUMMARY OF THE INVENTION

Unfortunately, the FRA methods disclosed in Patent Literatures 1 to 3 are methods including inputting a sinusoidal wave at a predetermined frequency to perform a measurement. Thus, it is only possible to determine impedance at the predetermined frequency. In order to obtain impedance characteristics across broad frequency range, sinusoidal waves with different frequencies should be sequentially input, which requires considerable measurement time.

Accordingly, it is difficult to perform real-time analysis of a rapid phenomenon whose effect occurs in a low-frequency range.

In addition, signals with different frequencies cannot be simultaneously applied. For example, it is impossible to simultaneously determine and analyze a concentration overvoltage that occurs during the above flooding at the time of membrane resistance measurement.

Also, a superimposing device which applies an accurate sinusoidal wave is costly. When the sinusoidal wave is applied, a current wave form differs from that of normal operation. This frequently causes the situation that the measurement cannot be performed at any given timing.

Alternatively, a method disclosed in Non-Patent Document 1 requires application of multiple-LPF (Low Pass Filter) signal processing for an applied signal. Besides, the method requires application of the LPF even at an analysis step. Such processing has been complicated. In addition, a noise distribution may cause a large error, so that the method is unreliable.

Further, Non-Patent Document 2 fails to disclose precise white characteristics of an input signal, which does not guarantee an accurate measurement. Furthermore, a device which applies the input signal is costly.

Moreover, in Non-Patent Document 3, when an identifier circuit does not work properly, its error becomes large and its identification calculation requires considerable time.

Here, the present invention has been completed so as to solve the above problems. It is an object of the present invention to provide a sequential impedance measurement device which can appropriately determine impedance of a fuel cell. It is another object of the present invention to provide a method for sequentially measuring impedance and to provide a fuel cell system.

In order to achieve the above objects, each embodiment of the present invention includes the following elements.

Specifically, a sequential impedance measurement device according to an embodiment of the present invention includes a sequential impedance measurement device in which impedance of a fuel cell is sequentially measured in a control system, the control system using a power indication value or a current indication value to control the fuel cell and a battery, the values being calculated by a control processor based on a load output value and an output indication value for a fuel cell system, the fuel cell system including the fuel cell and the battery and supplying power to a load, the device including: an M-sequence-signal-generating section which generates a binary or more M-sequence signal with a white power spectrum; a superimposed-signal-generating section which generates a superimposed signal superimposed on the M-sequence signal; a signal-processing section which combines the M-sequence signal and the superimposed signal or which separately outputs the M-sequence signal or the superimposed signal; a first signal-adding unit which superimposes and applies a signal output from the signal-processing section on the power indication value or the current indication value, the values being sent by the control processor; a second signal-adding unit which superimposes and applies a signal inverted from the signal output from the signal-processing section on the power indication value or the current indication value, the values being sent by the control processor; a current and voltage measuring unit which measures and incorporates a current and a voltage of the fuel cell, the fuel cell being controlled by a signal generated by the first signal-adding unit; and an impedance calculator which calculates the impedance of the fuel cell, the calculation based on values of the current and the voltage measured by the current and voltage measuring unit, wherein a signal after the application in the second signal-adding unit is output to control the battery; and a calculation result of the impedance calculator is output as a measured result.

In addition, a method for sequentially measuring impedance according to an embodiment of the present invention includes: superimposing an M-sequence signal and a superimposed signal on a current input signal of a fuel cell during a sequential impedance measurement of the fuel cell to obtain sequential input data, the M-sequence signal having binary or more M-sequence data with a white power spectrum, the superimposed signal having predetermined sequential data with a cycle sufficiently longer than a cycle of the M-sequence data; obtaining sequential output data generated from a signal output from the fuel cell as a voltage; subjecting the sequential input data and the sequential output data to a process using FFT processing; and calculating impedance by using the two data processed.

In addition, a fuel cell system according to an embodiment of the present invention includes a fuel cell system which includes a fuel cell and a battery and supplies power to a load, and in which the fuel cell and the battery is controlled by using a power indication value or a current indication value, the values being calculated by a control processor based on a load output value and an output indication value sent to the fuel cell, the fuel cell system including an sequential impedance measurement device including: an M-sequence-signal-generating section which generates a binary or more M-sequence signal with a white power spectrum; a superimposed-signal-generating section which generates a superimposed signal superimposed on the M-sequence signal; a signal-processing section which combines the M-sequence signal and the superimposed signal or which separately outputs the M-sequence signal or the superimposed signal; a first signal-adding unit which superimposes and applies a signal output from the signal-processing section on the power indication value or the current indication value, the values being sent by the control processor; a second signal-adding unit which superimposes and applies a signal inverted from the signal output from the signal-processing section on the power indication value or the current indication value, the values being sent by the control processor; a current and voltage measuring unit which measures and incorporates a current and a voltage of the fuel cell, the fuel cell being controlled by a signal generated by the first signal-adding unit; and an impedance calculator which calculates impedance of the fuel cell, the calculation based on measured values of the current and the voltage of the current and voltage measuring unit, wherein a signal after the application in the second signal-adding unit is output to control the battery; and a method for controlling the fuel cell and the battery by the control processor is modified according to a calculation result of the impedance calculator.

Embodiments of the present invention can provide sequential impedance measurement devices capable of precisely measuring impedance of a fuel cell, methods for sequentially measuring impedance, and fuel cell systems.

BRIEF DESCRIPTION OF THE DRAWINGS

FIG. 5 illustrates M-sequence signal characteristics; FIG. 5A represents a portion of an M-sequence signal including data composed of –1s and 1s; FIG. 5B is a graph of an M-sequence signal, with the temporal and voltage axes being designated; FIG. 5C is a graph of a power spectrum of an M-sequence signal, with the frequency and gain axes being designated;

FIG. 6 illustrates how to select an M-sequence signal pattern according to different frequencies (calculation intervals)

FIG. 7 is characteristic diagrams illustrating a comparison between an only M-sequence signal and an M-sequence signal having a superimposed step signal, the signals being applied to a fuel cell.

FIG. 8 illustrates that a difference in a sequential input or output data average causes a variation in the precision of analyzing impedance at a low-frequency range.

FIG. 9A(a1) shows an only M-sequence signal; FIG. 9A(b1) shows an M-sequence signal having a superimposed step signal; FIG. 9A(c1) shows the (b1)'s signal having an additional, superimposed, monotonically increasing signal; FIGS. 9A(a3), 9A(b3), and 9A(c3) provide an overview of their effects;

FIG. 9B(d1) shows the (b1)'s signal having a superimposed sinusoidal wave at a frequency of 0.1 radian/second; FIG. 9B(e1) shows the (b1)'s signal having a superimposed sinusoidal wave at a frequency of 0.5 radian/second; FIG. 9B(f1) shows the (b1)'s signal having superimposed signals including a monotonically increasing signal, a sinusoidal wave at a frequency of 0.1 radian/second, and a sinusoidal wave at a frequency of 0.5 radian/second; FIGS. 9B(d3), 9B(e3), and 9B(f3) illustrate effects of these wave forms;

FIGS. 10(a1) and 10(a2) illustrate sequential data for an input current value and an output voltage value;

FIGS. 10(b1) and 10(b2) illustrate characteristic diagrams of the data of FIGS. 10(a1) and 10(a2) multiplied by a triangle window function.

FIG. 11 illustrates how to cut noise at a high-frequency range by multiplying FFT-processed impedance frequency characteristic data by a rectangular window function composed of "1" and "0" portions; FIG. 11(a) illustrates a frequency characteristic of resistance; FIG. 11(b) illustrates a frequency characteristic of reactance;

FIG. 12A(a) is a resistance characteristic diagram; FIG. 12A(b) is a reactance characteristic diagram;

FIG. 12B(a) is an exemplary Bode diagram which shows a gain; FIG. 12B(b) is an exemplary Bode diagram which shows a phase;

FIG. 14A is an exemplary time chart illustrating a relationship between impedance calculation and its image display when an M-sequence signal is continuously applied; and FIG. 14B is an exemplary time chart illustrating how to shorten an interval during impedance calculation.

DETAILED DESCRIPTION OF PREFERRED EMBODIMENTS

Embodiments of the present invention provide sequential impedance measurement devices and methods for sequentially measuring impedance. In the devices and the methods, while applying a signal having a power output fluctuation similar to that of normal operation, it is possible to carry out a quick measurement with relatively high precision and in a broad frequency range. Also, the devices and the methods can simultaneously determine phenomena which occur in different frequency ranges.

(First Embodiment: Sequential Impedance Measurement Device)

Figure 1:
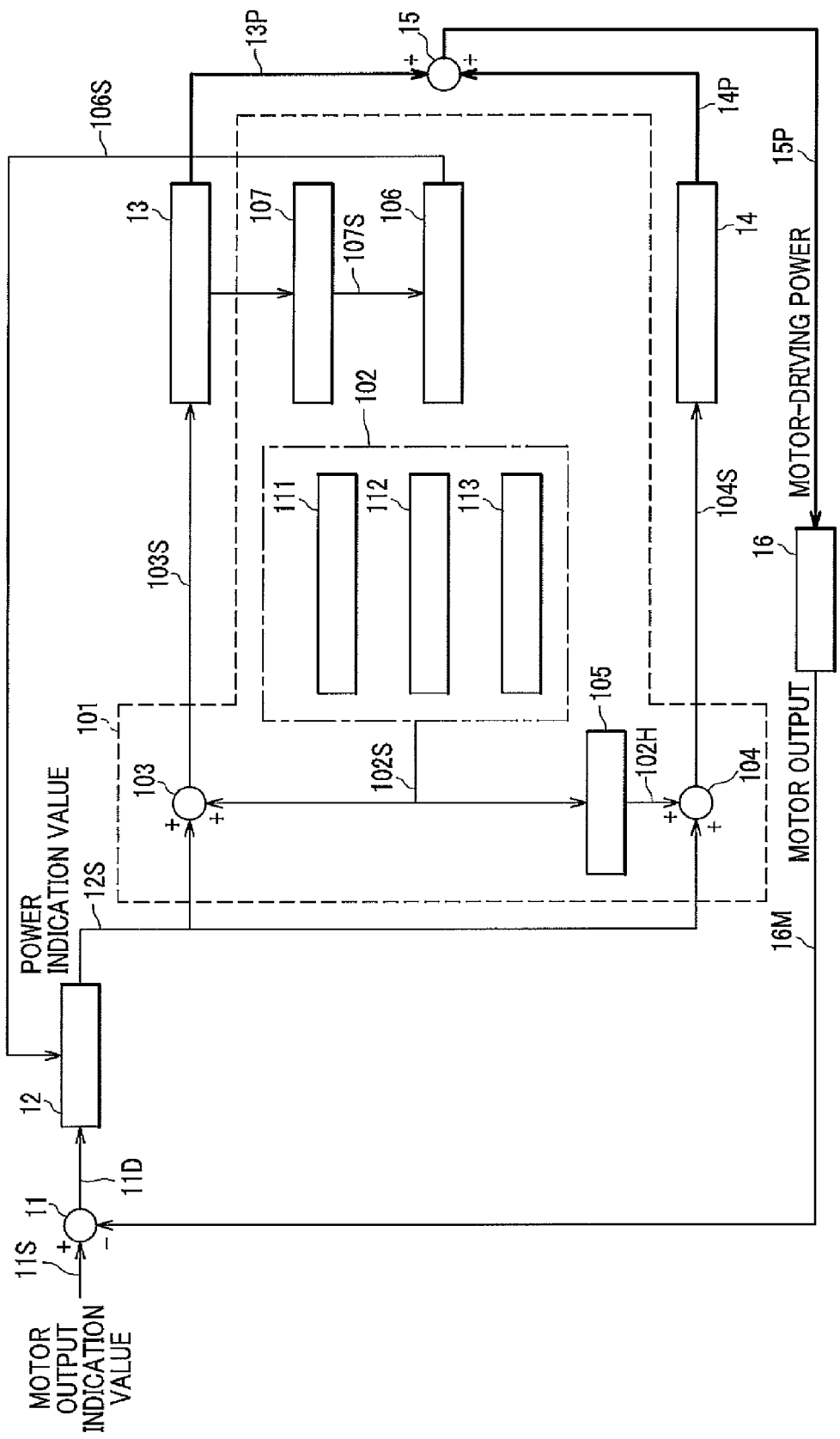
FIG. 1 illustrates the first configuration in which a fuel cell vehicle includes a sequential impedance measurement device according to the first embodiment of the present invention.

FIG. 1 illustrates the first configuration in which a fuel cell vehicle includes a sequential impedance measurement device according to the first embodiment of the present invention.

In FIG. 1, a sequential impedance measurement device 101 according to the first embodiment of the present invention includes an FFT impedance-measuring-signal-generating unit 102, a first signal-adding unit 103, a second signal-adding unit 104, a signal-inverting unit 105, an impedance calculator (designated as "IMP CALCULATOR" in FIG. 1) 106, and a current and voltage measuring unit 107.

In addition, the FFT impedance-measuring-signal generating unit 102 includes an M-sequence-signal-generating section 111, a superimposed-signal-generating section 112, and a signal-processing section 113.

A fuel cell vehicle (not shown) includes a fuel cell 13 which is a power source for driving a vehicle, a battery 14 which serves as an aid for the fuel cell 13, a motor 16 which drives the vehicle, a control processor 12 which directs a power output of the fuel cell 13 and the battery 14, a deviation signal unit 11 which sends a motor-information signal to the control processor 12, and a power-combining unit 15 which combines powers output from the fuel cell 13 and the battery 14.

The deviation signal unit 11 receives each of a motor output indication value (target current value) 11S and a motor output value (an actual current value, a motor output) 16M which reflects a drive output of the motor 16. The difference between the above values is output, as a deviation signal 11D, from the deviation signal unit 11 to the control processor 12. The control processor 12 receives the deviation signal 11D and an impedance-value-indicating signal 106S of the impedance calculator 106, and sends a power indication value 12S (or a current indication value 12S) to the sequential impedance measurement device 101. Note that the power indication value 12S is for the control processor 12 to direct a power level. When the control processor 12 directs a current value, the "current indication value 12S" is used.

The power indication value 12S enters the sequential impedance measurement device 101 to be further input to the first signal-adding unit 103 and the second signal-adding unit 104.

In the first signal-adding unit 103, the power indication value 12S is applied, and a superimposed synthetic signal 102S generated from the FFT impedance-measuring-signal-generating unit 102 is further applied and superimposed. Then, the first signal-adding unit 103 transmits a fuel cell command signal 103S to the fuel cell 13. The fuel cell 13 delivers a fuel cell output power 13P to the power-combining unit 15.

In addition, in the second signal-adding unit 104, the power indication value 12S is applied. Further, the FFT impedance-measuring-signal-generating unit 102 sends a signal through the signal-inverting unit 105. The resulting, inverted, superimposed synthetic signal 102H is then applied and superimposed. After that, the second signal-adding unit 104 transmits a battery command signal 104S to the battery 14. The battery 14 delivers a battery output power 14P to the power-combining unit 15.

The power-combining unit 15 combines the fuel cell output power 13P and the battery output power 14P to send them as a motor-driving power 15P to the motor 16. This power drives the motor.

Note that a chopper and/or an inverter (not shown) may be installed partway through the connection among the fuel cell 13, the battery 14, the power-combining unit 15, and the motor 16. The power output of the fuel cell 13 is consumed by an auxiliary device(s) (not shown) in addition to the motor.

Also, the fuel cell command signal 103S is output to a control circuit (not shown) of the fuel cell 13.

While driving, the motor 16 sends to the deviation signal unit 11 the motor output value 16M which reflects its drive output.

In addition, the current and voltage measuring unit 107 determines current and voltage values of the fuel cell 13, and sends the values as a measured current and voltage value 107S to the impedance calculator 106. The impedance calculator 106 performs a calculation such as an FFT calculation and window function processing as described below. Then, impedance in a predetermined frequency band is calculated. After that, the impedance calculator sends an impedance-value-indicating signal 106S to the control processor 12 as described above. According to the impedance-value-indicating signal 106S which transmits a calculation result of the impedance calculator 106, a method for controlling the fuel cell 13 and the battery 14 by the control processor 12 is modified. In an impedance measurement of fuel cell 13, the measurement subject is both a fuel cell and a fuel cell stack which is stacked the fuel cells.

Here, a supplementary description on the FFT impedance-measuring-signal-generating unit 102 is given. The FFT impedance-measuring-signal-generating unit 102 includes the M-sequence-signal-generating section 111, the superimposed-signal-generating section 112, and the signal-processing section 113.

The M-sequence-signal-generating section 111 generates an M-sequence signal with a white power spectrum.

The superimposed-signal-generating section 112 generates a predetermined superimposed signal such as a step signal described below.

The signal-processing section 113 combines the above M-sequence signal and predetermined superimposed signal. Then, an output signal (102S) of the signal-processing section 113 is an output of the FFT impedance-measuring-signal-generating unit 102.

Note that the M-sequence-signal-generating section 111, the superimposed-signal-generating section 112, and the signal-processing section 113 are modeled by software.

Also, the above M-sequence signal and predetermined superimposed signal are described in detail below.

In addition, a supplementary description on the signal-inverting unit 105 is given.

As described above, the FFT impedance-measuring-signal-generating unit 102 outputs a signal (the superimposed synthetic signal 102S) which combines the M-sequence signal and the predetermined superimposed signal. The signal goes through the first signal-adding unit 103 which adds the power indication value 12S. The resulting signal is applied to the fuel cell 13. The output power of the fuel cell 13 (the fuel cell output power 13P) goes through the power-combining unit 15 to be applied to the motor 16 as the motor-driving power 15P.

Thus, if the above pathway is unchanged, the motor-driving power 15P includes a power derived from the M-sequence signal and the predetermined superimposed signal. The M-sequence signal and the predetermined superimposed signal are effective in sequential impedance analysis, but are neither necessary nor preferable for the motor 16.

In order to eliminate such an influence of the M-sequence signal and the predetermined superimposed signal on the motor 16, there is provided a pathway including the signal-inverting unit 105. First, the M-sequence and predetermined superimposed signals (102S) of the FFT impedance-measuring-signal-generating unit 102 is inverted by the signal-inverting unit 105 to generate an inverted, superimposed synthetic signal 102H. This signal goes through the second signal-adding unit 104 which adds the power indication value 12S to generate the battery command signal 104S. The resulting signal is then applied to the battery 14. After that, the output power of the battery 14 is applied to the power-combining unit 15.

Thus, in the power-combining unit 15, the M-sequence and predetermined superimposed signals which have gone through the fuel cell 13 are combined with their inverted signals which have gone through the battery 14. The M-sequence and predetermined superimposed signals are therefore cancelled in the power-combining unit 15. This results in decreased reception, at the motor 16, of the M-sequence and predetermined superimposed signals, the signals being neither necessary nor preferable for the motor 16.

Because of the above, the signal-inverting unit 105 and its pathway are provided.

(Second Embodiment: Sequential Impedance Measurement Device)

Figure 2:
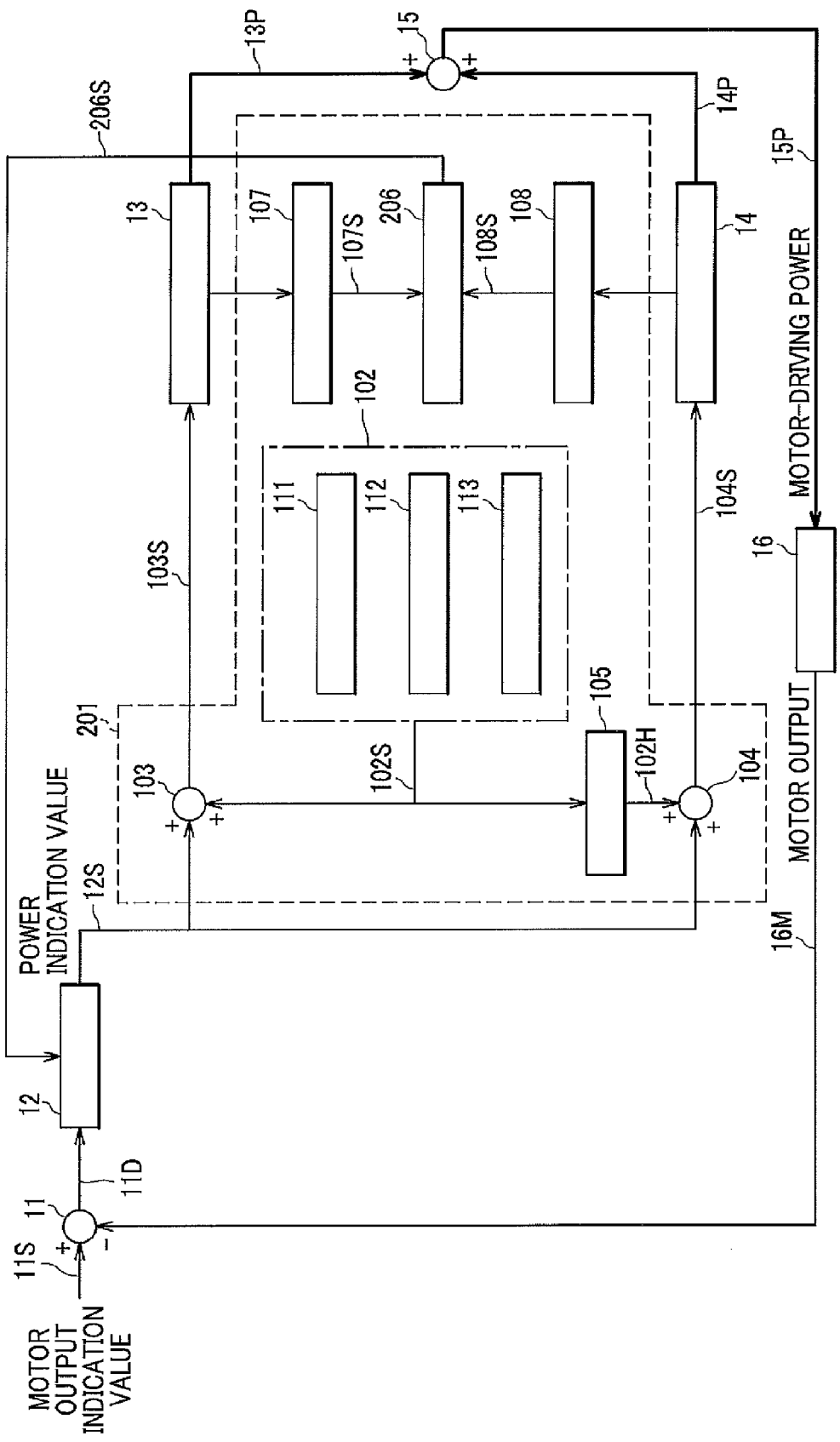
FIG. 2 illustrates the second configuration in which a fuel cell vehicle includes a sequential impedance measurement device according to the second embodiment of the present invention.

FIG. 2 illustrates the second configuration in which a fuel cell vehicle includes a sequential impedance measurement device according to the second embodiment of the present invention.

FIG. 2 differs from FIG. 1 in that a sequential impedance measurement device 201 further includes a second current and voltage measuring unit 108. The unit determines current and voltage values of the battery 14. Then, the unit sends to an impedance calculator 206 the values as a measured current and voltage value 108S.

The impedance calculator 206 performs not only an impedance calculation of the fuel cell 13 but also that of the battery 14. After that, the impedance calculator transmits an impedance-value-indicating signal 206S regarding the fuel cell 13 and the battery 14 to the control processor 12. Finally, the control processor 12 refers to the impedance values of the fuel cell 13 and battery 14 to control the power indication value 12S.

The above configuration allows for impedance measurements of both the fuel cell 13 and the battery 14 as described above. Accordingly, this configuration can control the fuel cell 13 and the battery 14 while keeping a more suitable vehicle condition.

In addition, the impedance of the battery 14 at this occasion is measured using an M-sequence signal. Accordingly, highly precise impedance characteristics including a frequency characteristic of the battery 14 can be determined. Hence, it is possible to precisely control not only the fuel cell 13 but also the battery 14.

Note that elements, functions, and operation other than those described above are the same as in FIG. 1, so that redundant descriptions are avoided.

(Device Configuration to Achieve FFT-Processed Impedance Measurement)

The following describes an FFT-processed impedance measurement in a sequential impedance measurement device according to an embodiment of the present invention.

Figure 3:
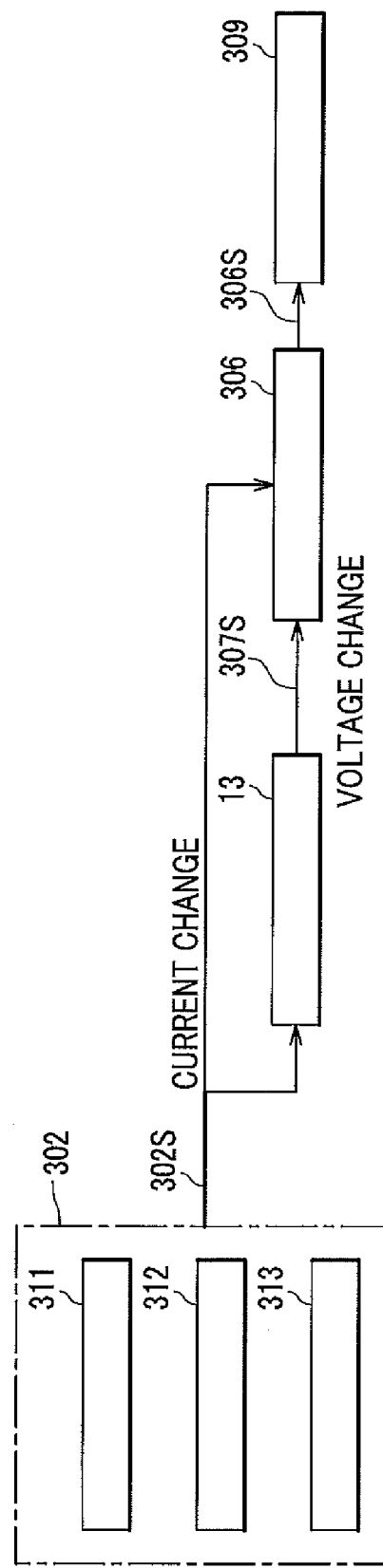
FIG. 3 illustrates how to configure an impedance measurement device and outlines an impedance measurement processed by FFT processing according to an embodiment of the present invention.

FIG. 3 illustrates how to configure an impedance measurement device and outlines an impedance measurement processed by FFT processing.

An FFT impedance-measuring-signal-generating unit (FFT impedance-measuring-signal generator) 302 includes an M-sequence-signal-generating section 311 and a superimposed-signal-generating section 312, and a signal-processing section 313. An M-sequence signal generated by the M-sequence-signal-generating section 311 and a superimposed signal generated by the superimposed-signal-generating section 312 are combined in the signal-processing section 313. Then, a superimposed synthetic signal 302S is produced and applied as a current change to the fuel cell 13 that remains a constant current load condition. As a result, an analyzing unit (analyzer) 306 inputs a measured voltage value 307S which indicates a voltage change occurring in the fuel cell 13. In addition, the analyzing unit 306 also inputs the superimposed synthetic signal 302S.

The analyzing unit 306 analyzes and calculates impedance in a predetermined frequency range by using the superimposed synthetic signal 302S which corresponds to a current change in the fuel cell 13 and the measured voltage value 307S which corresponds to a voltage change in the fuel cell 13.

Note that the analyzing unit 306 includes a calculator (software) for performing statistical processing to enhance analysis precision and various calculators (software) for drawing a Bode diagram and/or a Cole-Cole plot.

As described above, the analyzing unit 306 carries out an impedance characteristic calculation and calculations for various related characteristics and diagrams. The analyzing unit outputs an analysis signal 306S to display on a monitor-image control unit 309 (a monitor-image controller) an impedance characteristic as a form of a Bode diagram and/or a Cole-Cole plot, etc.

Note that the analyzing unit 306 has functions substantially equivalent to those of the impedance calculator 106 (FIG. 1). The analyzing unit may differ from the impedance calculator 106 which a vehicle is presumed to include in FIG. 1.

In addition, the M-sequence-signal-generating section 311 has a functional configuration substantially equivalent to that of the M-sequence-signal-generating section 111 (FIGS. 1 and 2). Further, the superimposed-signal-generating section 312 has a functional configuration substantially equivalent to that of the superimposed-signal-generating section 112 (FIGS. 1 and 2). Furthermore, the signal-processing section 313 has a functional configuration substantially equivalent to that of the signal-processing section 113 (FIGS. 1 and 2).

Also, the sequential impedance measurement device included in the fuel cell vehicle illustrated in FIGS. 1 and 2 may not include the monitor-image control unit 309.

Moreover, in FIG. 3, a real fuel cell is used as the fuel cell 13 at the time of measurement. At the time of simulation by using software, however, an equivalent circuit which models the fuel cell is used.

(Third Embodiment: Method for Sequentially Measuring Impedance)

The following below describes another embodiment, a method for sequentially measuring impedance according to the third embodiment of the present invention.

(Flow of Impedance Measurement Processed by FFT Processing)

The following illustrates how to process an impedance measurement by FFT processing in a method for sequentially measuring impedance.

Figure 4:
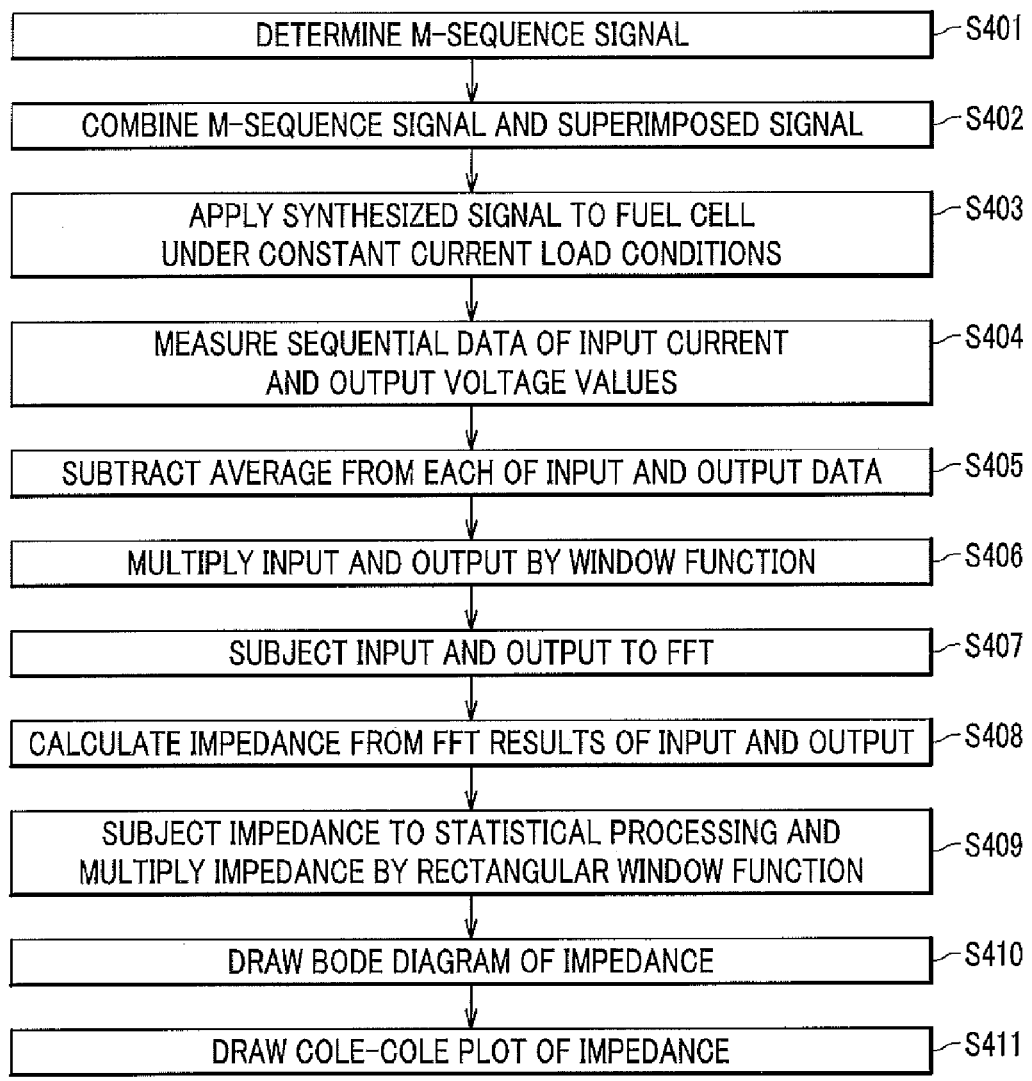
FIG. 4 is a flow chart illustrating how to process an impedance measurement by FFT processing according to an embodiment of the present invention.

FIG. 4 is a flow chart illustrating how to process an impedance measurement by FFT processing. The flow chart describes each step one by one.

<<Step S401>>

First, an M-sequence signal is determined. The M-sequence has various patterns such as a short one and a long one. Depending on a calculation time (calculation speed) and precision conditions involving a calculation, the M-sequence signal is selected and determined.

Note that in FIG. 3, the M-sequence-signal-generating section 311 of the FFT impedance-measuring-signal-generating unit 302 determines the M-sequence signal.

Of note is that in FIG. 4, step S401 is designated as "DETERMINE M-SEQUENCE SIGNAL".

In addition, the M-sequence signal is detailed later.

<<Step S402>>

Next, the M-sequence signal and a superimposed signal such as a step signal are synthesized.

In FIG. 3, the signal-processing section 313 of the FFT impedance-measuring-signal-generating unit 302 combines the M-sequence signal generated by the M-sequence-signal-generating section 311 and the superimposed signal, such as a step signal, generated by the superimposed-signal-generating section 312. Note that in FIG. 4, step S402 is designated as "COMBINE M-SEQUENCE SIGNAL AND SUPERIMPOSED SIGNAL".

In addition, the superimposed signal is detailed later.

<<Step S403>>

The next step is to apply a synthesized signal including the M-sequence signal and the superimposed signal to the fuel cell 13 under constant current load conditions (FIG. 3).

Application of this signal is to measure broad band frequency responses by using the M-sequence signal and is to measure the responses while increasing calculation precision in a low-frequency range by using the superimposed signal such as a step signal.

Note that this application of the signal gives the fuel cell 13 a current change.

Also, in FIG. 4, step S403 is designated as "APPLY SYNTHESIZED SIGNAL TO FUEL CELL UNDER CONSTANT CURRENT LOAD CONDITIONS".

<<Step S404>>

The next step is to measure input current and output voltage values of the fuel cell 13 in which the above synthesized signal has been applied. The M-sequence signal and the superimposed signal such as a step signal are a sequential signal, so that the output voltage value also includes sequential data. In FIG. 3, the analyzing unit (analyzer) 306 determines the signal 302S of a current change and the signal 307S of a voltage change. Note that FIG. 3 depicts neither input current meter nor output voltage meter.

Also, in FIG. 4, step S404 is designated as "MEASURE SEQUENTIAL DATA OF INPUT CURRENT AND OUTPUT VOLTAGE VALUES".

<<Step S405>>

The next step is to subtract their average from each of the input current value and the output voltage value. That is, statistical processing is carried out.

This is because when the average of each of the input current value and the output voltage value is substantially 0, its precision increases.

More specifically, each sequential input and output data of the input current and output voltage values is made zero (0) or substantially zero (which is preferably ±50% or less of each amplitude variation of the input current value and the output voltage value) as preprocessing. An FFT calculation follows this preprocessing. Note that window function processing as described in step S406 below may be performed between the preprocessing and the FFT calculation.

In addition, the analyzing unit (analyzer) 306 illustrated in FIG. 3 performs a process for making the average zero or substantially zero as preprocessing. Alternatively, the process may be performed in an impedance calculator 106 or 206 as illustrated in FIG. 1 or 2.

Also, in FIG. 4, step S405 is designated as "SUBTRACT AVERAGE FROM EACH OF INPUT AND OUTPUT DATA".

Additionally, a process for making the average zero or substantially zero as preprocessing is detailed later.

<<Step S406>>

The next step is to multiply each of the input current value and the output voltage value by a window function.

This step is to increase analysis and calculation precision. In addition, software performs this process. Note that the analyzing unit (analyzer) 306 as illustrated in FIG. 3 performs this step.

Also, in FIG. 4, step S406 is designated as "MULTIPLY INPUT AND OUTPUT BY WINDOW FUNCTION".

Additionally, this window function is detailed later.

<<Step S407>>

The next step is to perform FFT processing for the input current value and the output voltage value.

This is because the M-sequence signal is applied to the input current value, so that its data includes mixed numerous frequency characteristics in its time domain. Hence, the data is not represented by the individual frequency characteristics. In order to obtain impedance data regarding frequency characteristics, each characteristic is subjected to FFT processing, a Fourier transform.

This FFT processing converts the input current and output voltage values, which are sequential data, to input current and output voltage values that are represented by the frequency characteristics.

Note that the analyzing unit (analyzer) 306 as illustrated in FIG. 3 performs this step. Also, in FIG. 4, step S407 is designated as "SUBJECT INPUT AND OUTPUT TO FFT".

<<Step S408>>

The next step is to use data of the input current and output voltage values represented by frequency characteristics as obtained in step S407 in which the FFT processing is carried out. Then, impedance that is represented by the frequency characteristics is calculated.

Note that the analyzing unit (analyzer) 306 as illustrated in FIG. 3 performs this step.

Also, in FIG. 4, step S408 is designated as "CALCULATE IMPEDANCE FROM FFT RESULTS OF INPUT AND OUTPUT".

<<Step S409>>

Next, the impedance as obtained in step S408 is subjected to statistical processing, and is multiplied by a rectangular window function. These two processes are separately performed or combined.

Note that the analyzing unit (analyzer) 306 as illustrated in FIG. 3 performs this step.

Also, in FIG. 4, step S409 is designated as "SUBJECT IMPEDANCE TO STATISTICAL PROCESSING AND MULTIPLY IMPEDANCE BY RECTANGULAR WINDOW FUNCTION".

In addition, a process for subjecting impedance to statistical processing and a process for multiplying impedance by a rectangular window function are detailed later. Note that the "process for multiplying impedance by a rectangular window function" is also referred to as "rectangular window processing".

<<Step S410>>

The next step is to draw a Bode diagram of impedance by using the impedance that is represented by the frequency characteristics as obtained in steps S408 and S409.

Note that the monitor-image control unit 309 illustrated in FIG. 3 performs this step.

Also, in FIG. 4, step S410 is designated as "DRAW BODE DIAGRAM OF IMPEDANCE".

In addition, drawing a Bode diagram of impedance is detailed later.

<<Step S411>>

The next step is to draw a Cole-Cole plot of impedance by using the impedance that is represented by the frequency characteristics as obtained in steps S408 and S409.

Note that the monitor-image control unit 309 illustrated in FIG. 3 performs this step.

Also, in FIG. 4, step S411 is designated as "DRAW COLE-COLE PLOT OF IMPEDANCE".

In addition, drawing a Cole-Cole plot of impedance is detailed later.

The above flow chart illustrating how to process an impedance measurement by FFT processing as shown in FIG. 4 is an example. It is possible to add below-described various calculations and subroutines in the measurement step to the flow chart illustrated in FIG. 4.

<<M-Sequence Signal Characteristics>>

The following describes M-sequence signal characteristics.

FIG. 5 illustrates M-sequence signal characteristics. FIG. 5A represents a portion of an M-sequence signal including data composed of −1s and 1s. FIG. 5B is a graph of an M-sequence signal, with the temporal and voltage axes being designated. FIG. 5C is a graph of a power spectrum of an M-sequence signal, with the frequency and gain axes being designated.

FIG. 5A illustrates an example where a data set composed of −1s and 1s continuously or variably arranged to form a certain data sequence (having $2^n$ components). The M-sequence signal has a finite pattern. After the certain number of the patterns, the same patterns are repeated. This data sequence is referred to as an M-sequence signal, which is generated by a predetermined circuit and/or a rule function. The signal constitutes an apparent random variation (which is not really a completely random one) composed of −1s and 1s. Accordingly, the signal contains broad frequency components and is thus frequently used as an alternative for a white signal. Note that there exists no completely white signal having a stable power spectrum within all the frequency bands. Hence, the M-sequence signal can be used as an alternative for the white signal.

Of note is that FIG. 5A illustrates an example of the M-sequence signal in which "−1" starts and continues from the beginning. The one portion designated as "−1" is a minimum unit of time sequence. Then, this minimum unit is the minimum cycle of the M-sequence. When the minimum cycle of the M-sequence is to be shortened, the signal frequency is made higher. In addition, when the minimum cycle of the M-sequence is to be extended, the signal frequency is made lower.

FIG. 5B is a graph of the M-sequence signal, with the temporal axis (abscissa) and voltage axis (ordinate) being designated. The abscissa represents a time (sec). The ordinate represents a voltage level. Over the time course fluctuates a voltage between two values in which the average is 0.5 V, the bottom is 0.49 V (corresponding to "1"), and the top is 0.51 V (corresponding to "−1"). The graph shows the case with a minimum unit of time change, which unit is a minimum cycle of $10^{-4}$ sec.

In FIG. 5A, the data sequence is represented by 1s and −1s. When used in practice, the M-sequence signal fluctuates between predetermined biases (i.e., voltage values) to have a predetermined amplitude (a voltage change width) as illustrated in FIG. 5B. Various amplitudes and biases are used.

While in FIG. 5B, the ordinate represents a voltage level, the ordinate can also employ a current value. Thus, the M-sequence signal having a current change can also be used.

FIG. 5C is a graph of a power spectrum of an M-sequence signal (illustrated in FIG. 5B), with the frequency and gain axes being designated. An ideal white signal should have a constant power spectrum (gain) within all the frequency ranges. The M-sequence signal that is an alternative for the white signal, however, fails to have a constant power spectrum as shown in FIG. 5C.

Given the example of FIG. 5C, the M-sequence signal can be used as an alternative for the white signal if a low-frequency range (5 Hz or less) and a high-frequency range (500 Hz or more) are cut. Thus, the M-sequence signal can be used as a signal that can readily reproduce an artificial white power spectrum. The power spectrum varies depending on the data length and cycle of the M-sequence signal. The M-sequence signal is therefore selected and determined depending on its purposes (e.g., a calculation time, precision, frequency band).

<<Selection of M-Sequence Signal Pattern>>

The following describes selection of an M-sequence signal pattern. Note that the selection of the M-sequence signal pattern corresponds to step S401 of the flow chart for an impedance measurement processed by FFT processing in FIG. 4.

Figure 6A:
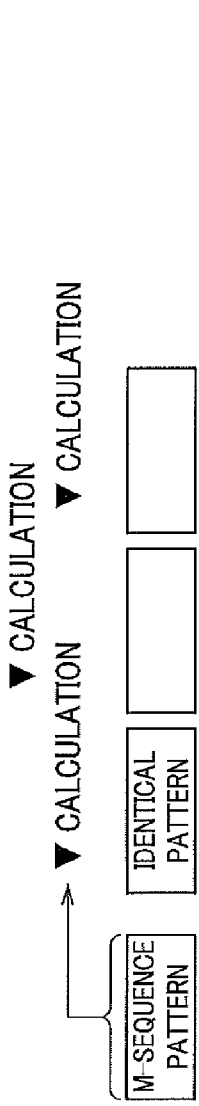
FIG. 6A illustrates a pattern for a high frequency.
Figure 6B:
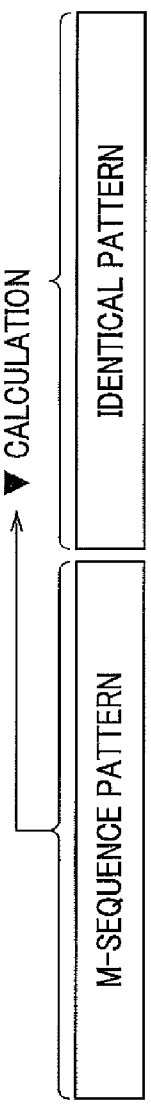
FIG. 6B illustrates a pattern for a low frequency.
Figure 6C:
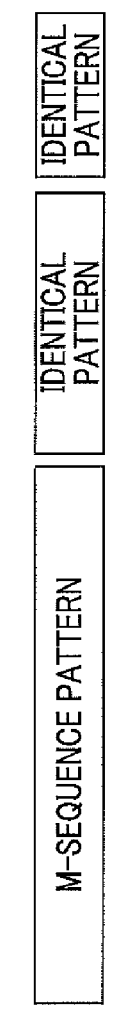
FIG. 6C illustrates an exemplary pattern for all the frequencies.

FIG. 6 illustrates how to select an M-sequence signal pattern according to different frequencies (calculation intervals). FIG. 6A illustrates a pattern for a high frequency. FIG. 6B illustrates a pattern for a low frequency. FIG. 6C illustrates an exemplary pattern for all the frequencies.

FIG. 6A illustrates an M-sequence pattern of the M-sequence signal that is suitable for calculating impedance in a high-frequency range during impedance calculation. A short M-sequence pattern is repeatedly applied for calculation. A higher impedance calculation frequency causes its precision to improve.

The short M-sequence pattern contains a few low-frequency components but a relatively more high-frequency components. Thus, in order to calculate impedance in a high-frequency range, there is no difficulty achieving higher precision. Besides, the short pattern allows for a short calculation interval and enables many sample data to be collected. This makes it possible to shorten a calculation time. Hence, the short pattern can be said to be suitable for a high frequency.

In the fuel cell 13 of a fuel cell vehicle, determination of membrane resistance requires data in a range with quick response. That is, a pattern with a short minimum cycle of the M-sequence is adopted, the pattern being represented by the pattern suitable for a high frequency as illustrated in FIG. 6A.

FIG. 6B illustrates an M-sequence pattern of the M-sequence signal that is suitable for calculating impedance in a low-frequency range during impedance calculation. A relatively long M-sequence pattern is used to repeatedly apply the same pattern for calculation.

In order to achieve predetermined precision during impedance calculation in a low-frequency range, an M-sequence signal including low frequencies is needed. Because of the above, it is required to use an M-sequence pattern with a relatively long data sequence. Use of the M-sequence pattern with a long data sequence results in a long calculation interval and a prolonged overall calculation time.

For a measurement in a range with slow response, such as a measurement for a concentration overvoltage of the fuel cell 13 of a fuel cell vehicle, a pattern with a long minimum cycle of the M-sequence is adopted, the pattern being represented by the pattern suitable for a low frequency as illustrated in FIG. 6B.

FIG. 6C illustrates an M-sequence pattern of the M-sequence signal that is suitable for calculating impedance in all the frequency ranges including low-frequency and high-frequency ranges during impedance calculation.

In the case of all the frequency ranges, M-sequence patterns with different lengths of the data sequence are combined and then used. Including an M-sequence pattern with a long data sequence enables impedance calculation precision in a low-frequency range to be retained. Also, including an M-sequence pattern with a short data sequence enables a calculation interval to be shortened as much as possible, Note that the long M-sequence pattern for a low-frequency range significantly occupies the calculation interval. The short M-sequence pattern for a high-frequency range and a medium M-sequence pattern account for the rest of the calculation interval to have a calculation time ($\alpha$).

If data on the short M-sequence pattern is obtained and impedance in a high-frequency range is calculated immediately after that, the resulting impedance can be displayed in the order from the high-frequency range.

In addition, examples of the above selection of the M-sequence signal pattern include a method for modifying a gain of an M-sequence signal in a low-frequency range by modifying the number of components of the M-sequence signal.

Furthermore, it is possible to use not only a binary (e.g., 1 and −1) but also three-valued (e.g., 1, 0, −1) or five-valued M-sequence.

A variety of combinations among the above methods allows an appropriate M-sequence signal pattern to be selected for a measurement of interest.

It is desirable to optionally determine the minimum cycle of the M-sequence depending on low-load and high-load ranges in the fuel cell 13 of a fuel cell vehicle. Thus, in order to appropriately and quickly provide fuel cell impedance necessary for control of a fuel cell vehicle, the sequential impedance measurement devices 101 and 201 illustrated in FIGS. 1 and 2 can switch an input M-sequence signal.

Examples of the case of using a pattern with a short minimum cycle of the M-sequence signal and with a short data sequence length include the case of requiring only membrane resistance and the times of stoppage, scavenging, start, low-temperature start, high-altitude driving, and high-temperature hill climbing.

In addition, when ionomer resistance is calculated, it is preferable to use a pattern with a short minimum cycle of the M-sequence signal and with a short data sequence length.

Also, examples of the case of using a pattern with a long minimum cycle of the M-sequence signal include the case of monitoring flooding, the time of idling, and the time of determination during transition from low-temperature start to warm-up.

In view of the above, the sequential impedance measurement devices 101 and 201 can switch between M-sequence data with different minimum cycles of the input M-sequence signal.

In addition, when a variation of impedance in a low-frequency range as described below is equal to or greater than a predetermined value (e.g., about 1 to 5 m$\Omega$), the minimum cycle of the above M-sequence signal is made longer.

<<Current (Voltage) Variation Amplitude of M-Sequence Signal Applied>>

The following describes a current change width (voltage change width) of an M-sequence signal applied.

It is preferable that a current change width (voltage change width) of the M-sequence signal is substantially equal to or more than half a current (voltage) noise amplitude that has been predetermined. Provided that the signal meets conditions regarding this noise amplitude, it is preferable to use a signal with as small a variation amplitude as possible.

Also, it is desirable that a response voltage change width (response current change width), which is an output voltage (current) at the time of application of a current change (voltage change) of the M-sequence signal, is substantially equal to or more than half a voltage noise (current noise).

Alternatively, immediately before the M-sequence signal is applied, input current noise and output voltage noise are observed (measured). Then, a variation amplitude of the M-sequence signal to be applied may be determined.

In addition, when the M-sequence signal is applied, its noise observed is measured. When an increase in the noise causes the amplitude (variation amplitude) of the M-sequence signal to become substantially less than half the noise amplitude, the application of the M-sequence signal is terminated. The amplitude (variation amplitude) of the M-sequence signal is made to increase to a variation amplitude that is substantially equal to or more than half the noise amplitude but is as small as possible. Accordingly, it is possible to employ a method for restarting the above-described application of the M-sequence signal.

Further, in order to properly control the above M-sequence signal, the current and voltage measuring unit 107 and the impedance calculators 106 and 206 or the analyzing unit 306 constantly monitor the noise amplitude of the input current and the output voltage (also referred to as "input and output").

Additionally, when the above M-sequence signal is applied, the above noise amplitude is measured. When the variation amplitude of the M-sequence signal becomes less than half the noise amplitude, the application of the M-sequence signal is terminated. Then, the M-sequence amplitude (the amplitude of the M-sequence signal) is made to exceed substantially half the noise amplitude. After that, it is possible to employ a method for restarting the application of the M-sequence signal.

<<Relationship Between Cycle of Sampling Current and Voltage Data and Minimum Cycle of M-Sequence>>

The following describes a relationship between a cycle of sampling current and voltage data and the minimum cycle of the M-sequence. This corresponds to step S404 of the flow chart for an impedance measurement processed by FFT processing in FIG. 4.

A cycle of sampling current and voltage data necessary for impedance calculation requires at least two times the minimum cycle of the M-sequence. In order to determine, with increased precision, the data in a high-frequency range at the minimum or longer cycle of the M-sequence, it is desirable to use a sampling cycle about 20 times or longer than the minimum cycle.

In addition, when the data is sampled at a cycle about 100 times or more than the minimum cycle of the M-sequence, the noise of the obtained data is reduced by using statistical processing (e.g., an average, median, mode, or application of a low-pass filter) once. Then, the resulting data can be transmitted to the impedance calculator 106 or 206. Note that when transmitted to the impedance calculator 106 or 206 after the reduction of this noise, the data should be transferred at a period about 20 times or longer than the minimum cycle of the M-sequence.

Calculation of the transferred data in the impedance calculator 106 or 206 under the above conditions makes it possible to increase impedance measurement precision in a high-frequency range at the minimum or longer cycle of the M-sequence.

<<Application of Superimposed Signal•Step Signal>>

The following describes the case where a step signal is superimposed on the M-sequence signal and the resulting signal is applied to the fuel cell 13. Note that combining the M-sequence signal with a superimposed signal corresponds to step S402 of the flow chart for an impedance measurement processed by FFT processing in FIG. 4.

Figure 7A:
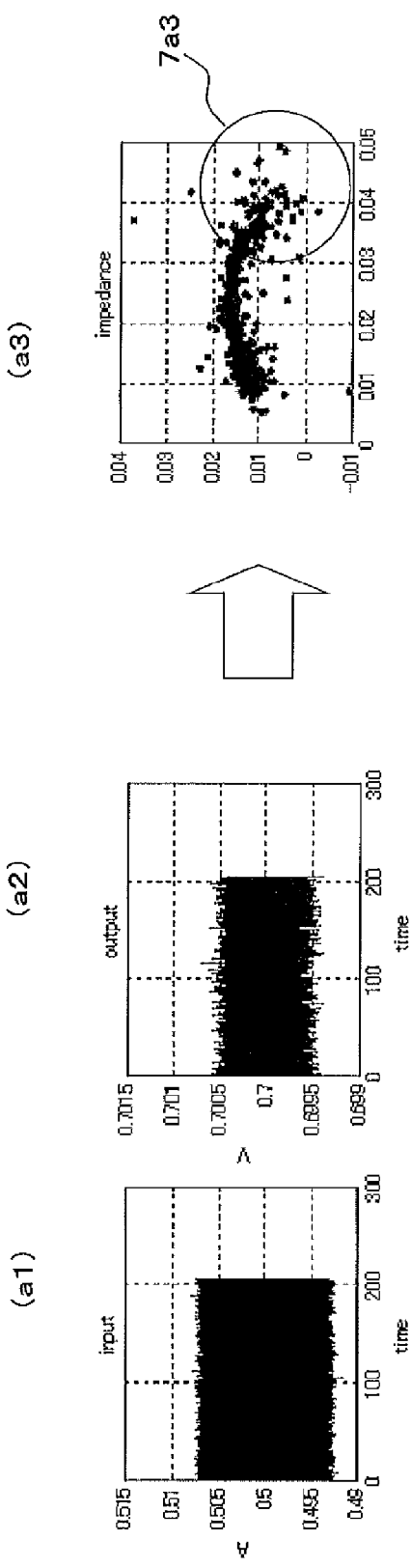
FIGS. 7A(a1), 7A(a2), and 7A(a3) are, as an example, an input current characteristic diagram, an output voltage characteristic diagram, and a Cole-Cole plot, respectively, when only the M-sequence signal is applied.
Figure 7B:
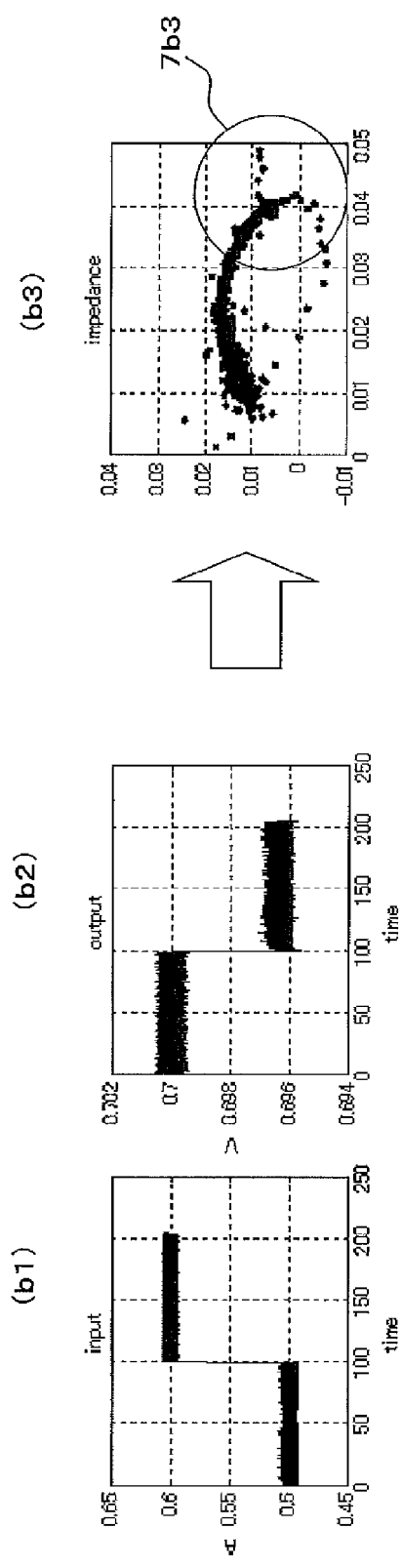
FIGS. 7B(b1), 7B(b2), and 7B(b3) are, as an example, an input current characteristic diagram, an output voltage characteristic diagram, and a Cole-Cole plot, respectively, when the M-sequence signal having a superimposed step signal is applied.

FIG. 7 is characteristic diagrams illustrating a comparison between an only M-sequence signal and an M-sequence signal having a superimposed step signal, the signals being applied to a fuel cell. FIGS. 7A(a1), 7A(a2), and 7A(a3) are, as an example, an input current characteristic diagram, an output voltage characteristic diagram, and a Cole-Cole plot, respectively, when the only M-sequence signal is applied. FIGS. 7B(b1), 7B(b2), and 7B(b3) are, as an example, an input current characteristic diagram, an output voltage characteristic diagram, and a Cole-Cole plot, respectively, when the M-sequence signal having a superimposed step signal is applied. When the Cole-Cole plot is calculated, only rectangular window function processing is applied instead of using statistical processing among processes described in step S409 of FIG. 4. Accordingly, a high-frequency range with large noise is cut.

Note that in FIGS. 7A(a1), 7A(a2), 7B(b1), and 7B(b2), a black band-like representation denotes a portion having an M-sequence signal because the M-sequence signal has a markedly higher frequency than the step signal.

Also, the Cole-Cole plot is detailed later.

FIGS. 7A(a1), 7A(a2), and 7A(a3) are an input current characteristic diagram, an output voltage characteristic diagram, and a Cole-Cole plot, respectively, when there is only an M-sequence signal. The input current characteristic diagram of FIG. 7A(a1) and the output voltage characteristic diagram of FIG. 7A(a2) delineate a state in which the M-sequence signal is applied or a state which is affected by the M-sequence signal.

In FIGS. 7A(a1) and 7A(a2), the abscissa represents a time (sec). The ordinate represents a current level (A) or a voltage level (V), respectively.

In addition, FIG. 7A(a3) is a Cole-Cole plot with a real part (resistance, the abscissa) and an imaginary part (reactance, the ordinate). The plot is prepared by the following procedure including: calculating the results of the graphs of FIGS. 7A(a1) and 7A(a2); and calculating frequency characteristics of impedance.

FIGS. 7B(b1), 7B(b2), and 7B(b3) are an input current characteristic diagram, an output voltage characteristic diagram, and a Cole-Cole plot, respectively, when a step signal is further superimposed on the M-sequence signal. The input current characteristic diagram of FIG. 7B(b1) and the output voltage characteristic diagram of FIG. 7B(b2) delineate a state in which the M-sequence signal having an additional superimposed step signal is applied or a state which is affected by the M-sequence signal having an additional superimposed step signal.

In FIGS. 7B(b1) and 7B(b2), the abscissa represents a time (sec). The ordinate represents a current level (A) or a voltage level (V), respectively.

In addition, FIG. 7B(b3) is a Cole-Cole plot with a real part (resistance, the abscissa) and an imaginary part (reactance, the ordinate). The plot is prepared by the following procedure including: calculating the results of the graphs of FIGS. 7B(b1) and 7B(b2); and calculating frequency characteristics of impedance.

In the Cole-Cole plots illustrated in FIGS. 7A(a3) and 7B(b3), the data is compared between the region 7a3 (a region inside a white circle) which shows an impedance characteristic in a low-frequency range when only the M-sequence signal is applied and the region 7b3 (a region inside a white circle) which shows an impedance characteristic in a low-frequency range when the M-sequence signal having an additional superimposed step signal is applied. The results demonstrate a less variation and a clearer distribution in the impedance characteristics of the region 7b3, which exhibits increased impedance precision.

This effect is achieved by superimposing an additional step signal on the M-sequence signal. The step signal has a slower signal change than the M-sequence signal. That is, the step signal has more low-frequency components than the M-sequence signal. This helps analyze data in a low-frequency range by superimposing a step signal because the low-frequency components supplied by the M-sequence signal alone are insufficient for the data analysis.

This effect is remarkable in a low-frequency range as demonstrated by the impedance characteristics of the region 7b3.

Note that an amplitude of the step signal superimposed on the input M-sequence signal is substantially equal to or two times or more than the M-sequence amplitude.

When $m_0$ is an integer of 1 or more and the M-sequence signal length (a volume of information) is $2^{m_0}-1$, a step interval of the superimposed step signal should be $(m_0+1)$ times or more than the minimum cycle of the M-sequence signal.

In addition, if current remains constant before and after the acquisition of the data on the M-sequence signal applied, it is effective in using a method which includes data on the constant state and uses the resulting data for impedance analysis (calculation).

The above-described method makes it possible to determine (measure) impedance with relatively high precision while applying a signal having a substantially similar fluctuation of a regular fuel cell output. This eliminates a need for providing a special measurement mode for an impedance measurement.

In addition, the above method can shorten an impedance measurement time in a broad frequency range, so that phenomena occurring in different frequency ranges can be simultaneously determined.

Further, the above method improves impedance precision in a low-frequency range. This allows a measurement time to be shortened by changing the M-sequence pattern used in the measurement to that with a short length.

Furthermore, there are phenomena, occurring in a low-frequency range, where a quick determination and its result presentation are conventionally impossible. Examples of the phenomena include a concentration overvoltage caused by a decreased gas concentration in a fuel cell. The concentration overvoltage can be determined as a change in sequential impedance calculation data by the above-described embodiment of the present invention.

Moreover, as described above, a method for inputting an M-sequence signal makes it possible to determine data in a relatively broad frequency range at once. For example, an M-sequence signal for a high-frequency range, which is used for determining a water content (a water content of electrolyte membrane), is input. This makes it easy to calculate a point of intersection in the abscissa of the Cole-Cole plot (e.g., a water content or membrane resistance). Performance of controlling a water content is therefore improved.

<<Averages of Measured Input and Output Values Are Made Zero>>

The following describes a process for improving precision of analyzing impedance at low frequencies, the process including: obtaining sequential data on an input and an output (i.e., an input current value and an output voltage value); and making an average of each data substantially 0. Note that this process corresponds to step S405 of the flow chart for an impedance measurement processed by FFT processing in FIG. 4. In addition, in step S409, only rectangular window processing is applied.

Figure 8A:
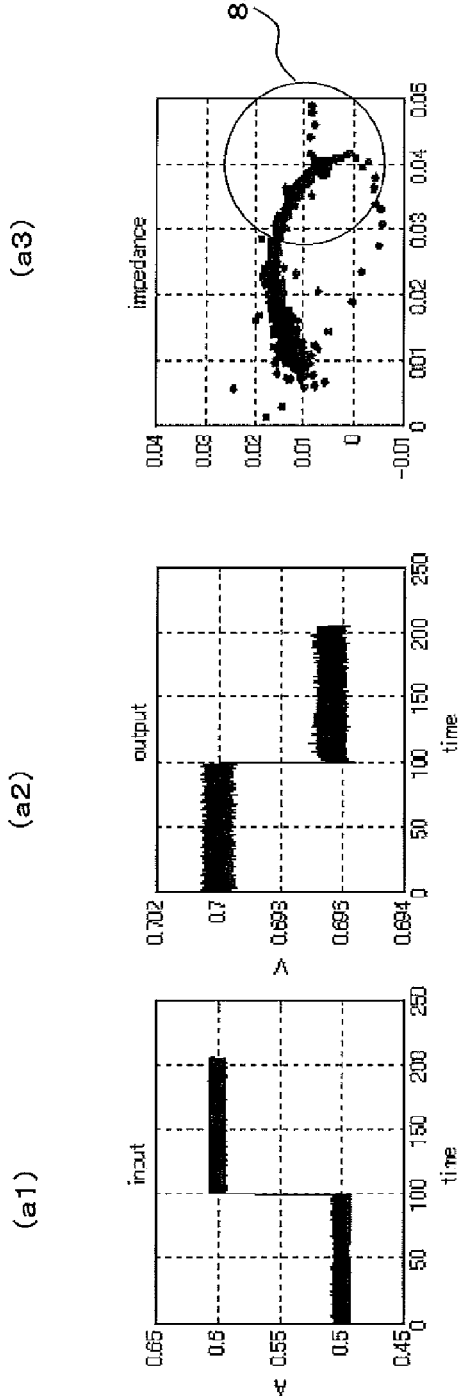
FIGS. 8A(a1), 8A(a2), and 8A(a3) are, as an example, an input current characteristic diagram, an output voltage characteristic diagram, and an impedance characteristic diagram, respectively, when measured values are left as they are.
Figure 8B:
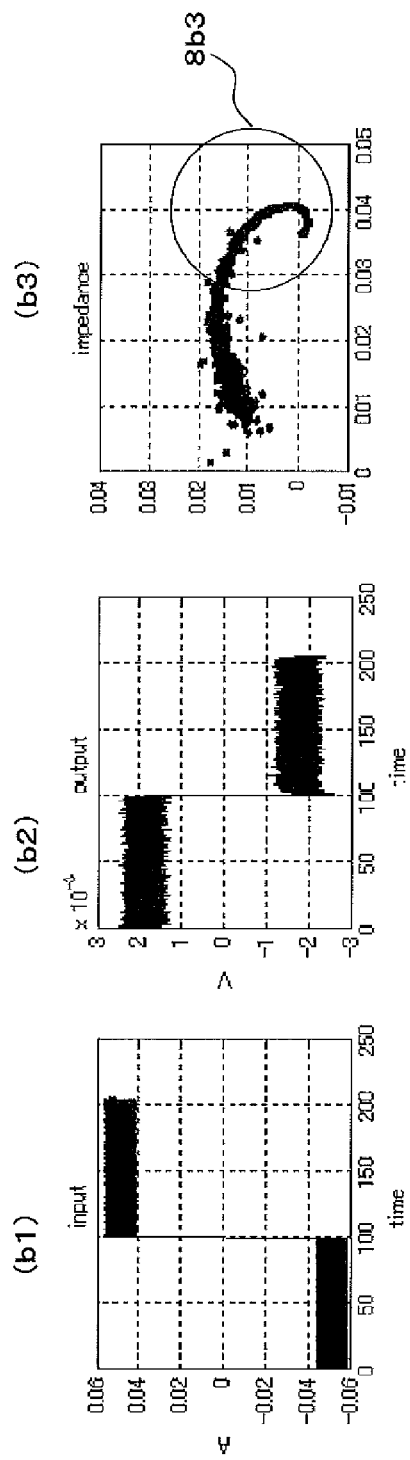
FIGS. 8B(b1), 8B(b2), and 8B(b3) are, as an example, an input current characteristic diagram, an output voltage characteristic diagram, and an impedance characteristic diagram, respectively, when averages of measured values are made substantially zero.

FIG. 8 illustrates that a difference in an average of sequential input and output data results in a variation of the precision of analyzing impedance at low frequencies. FIGS. 8A(a1), 8A(a2), and 8A(a3) are, as an example, an input current characteristic diagram, an output voltage characteristic diagram, and an impedance characteristic diagram, respectively, when measured values are left as they are. FIGS. 8B(b1), 8B(b2), and 8B(b3) are, as an example, an input current characteristic diagram, an output voltage characteristic diagram, and an impedance characteristic diagram, respectively, when averages of measured values are made substantially 0.

Both the average of the input current value in FIG. 8A(a1) and the average of the output voltage value in FIG. 8A(a2) are not 0. At this occasion, the input current value in FIG. 8A(a1) and the output voltage value in FIG. 8A(a2) are used to calculate impedance characteristic data in FIG. 8A(a3). The data vary in its distribution as observed in an impedance characteristic of the region 8a3. This results in decreased impedance precision in a low-frequency range (i.e., decreased precision of analyzing impedance at low frequencies).

In addition, the average of the input current value in FIG. 8B(b1) and the average of the output voltage value in FIG. 8B(b2) are compensated based on their original averages to have the resulting averages at substantially 0. The impedance characteristic data, which are shown in the region 8b3, as so calculated in FIG. 8B(b3) less vary than the above-described impedance characteristic data of the region 8a3. This results in increased impedance precision in a low-frequency range (i.e., increased precision of analyzing impedance at low frequencies).

Performing such a calculation (statistical processing) can enhance precision of analyzing impedance at low frequencies.

Note that the term "substantially 0" of the above average does not necessarily mean "exactly 0". Their average, however, should be ±50% or less of the variation amplitude of each of the above sequential input and output data.

<<Application of Superimposed Signal•Various Superimposed Signals>>

The following describes various signals that are superimposed on an M-sequence signal.

Figure 9A:
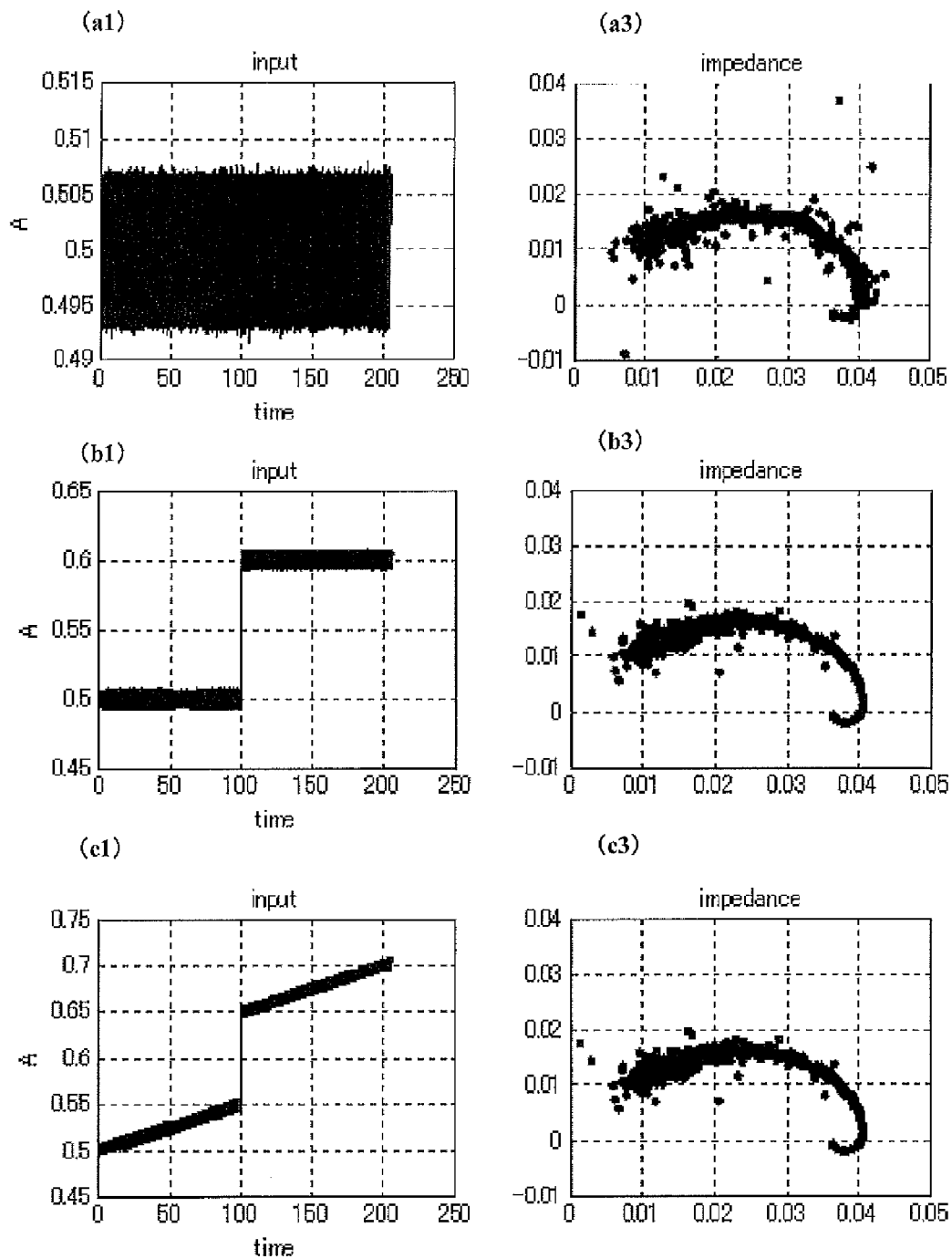
FIG. 9A includes diagrams illustrating a comparison among various signals that are superimposed on an M-sequence signal.
Figure 9B:
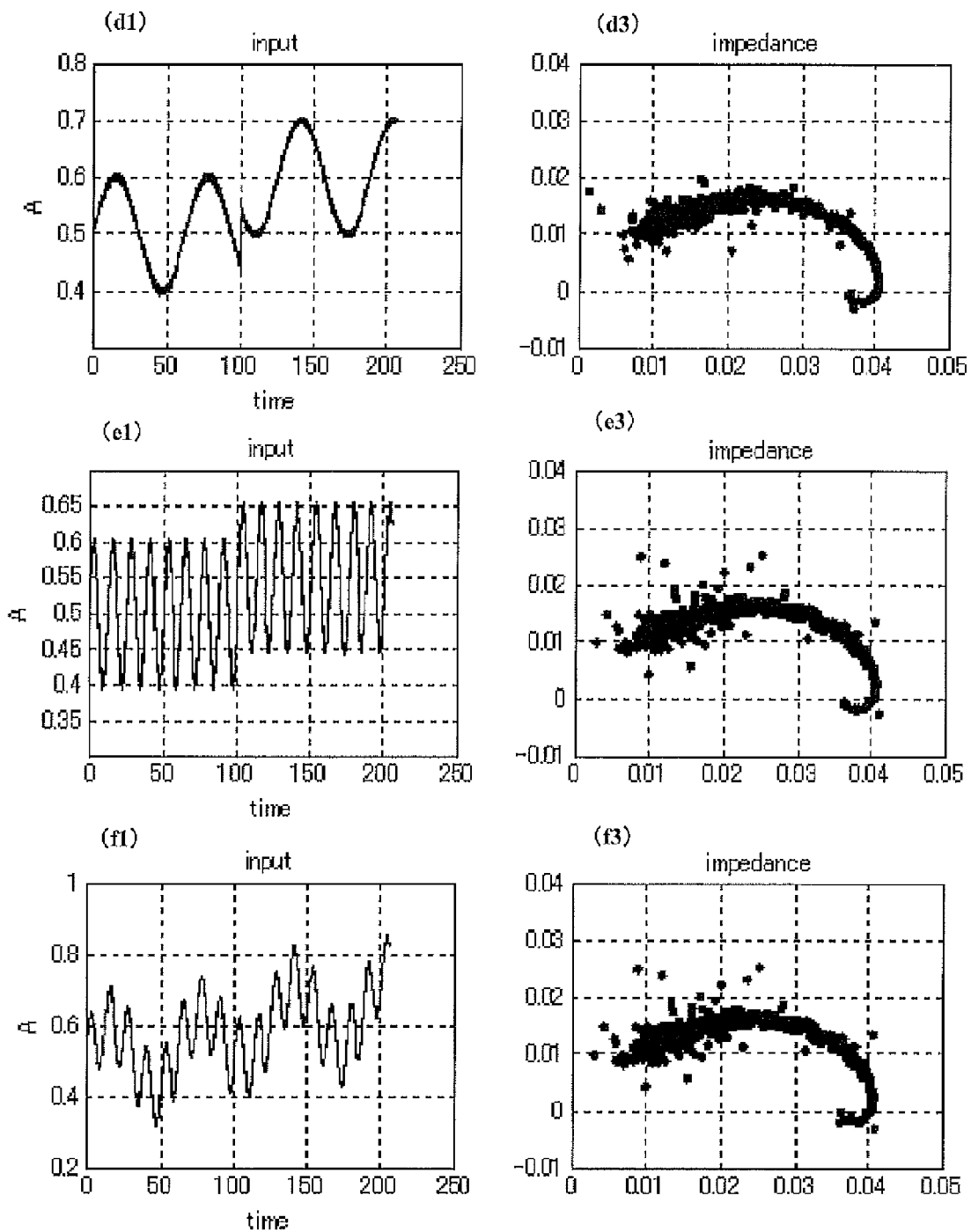
FIG. 9B includes diagrams illustrating additional various signals that are superimposed on an M-sequence signal.

FIGS. 9A and 9B illustrate various signals that are superimposed on an M-sequence signal and illustrate their effects.

FIG. 9A includes diagrams illustrating a comparison among various signals that are superimposed on an M-sequence signal. FIG. 9A(a1) shows an only M-sequence signal. FIG. 9A(b1) shows an M-sequence signal having a superimposed step signal. FIG. 9A(c1) shows the (b1)'s signal having an additional, superimposed, monotonically increasing signal. FIGS. 9A(a3), 9A(b3), and 9A(c3) provide an overview of their effects.

In addition, FIG. 9B includes diagrams illustrating additional various signals that are superimposed on an M-sequence signal. FIG. 9B(d1) shows the (b1)'s signal having a superimposed sinusoidal wave at a frequency of 0.1 radian/second. FIG. 9B(e1) shows the (b1)'s signal having a superimposed sinusoidal wave at a frequency of 0.5 radian/second. FIG. 9B(f1) shows the (b1)'s signal having superimposed signals including a monotonically increasing signal, a sinusoidal wave at a frequency of 0.1 radian/second, and a sinusoidal wave at a frequency of 0.5 radian/second. FIGS. 9B(d3), 9B(e3), and 9B(f3) illustrate effects of these wave forms.

All the data of FIGS. 9A and 9B (i.e., from (a3) to (f3)) are made to undergo the above process that <<Averages of Measured Input and Output Values Are Made Zero>>. Data (b3), (c3), (d3), (e3), and (f3), which represent effects of various signals superimposed on the M-sequence signal, less vary in a low-frequency range than data (a3), which represents an effect of the M-sequence signal alone. These data are found to have increased impedance precision.

These effects are generated because the superimposed step signal (b1) contains low-frequency components that are less included in the M-sequence signal.

Note that the following describes an example of conditions under which among signals superimposed on the M-sequence signal, a signal (sequential data) has an effect of increasing impedance precision.

In certain sequential data, the first segment thereof has the first constant value. In the second segment following the first segment, the first value is increased or decreased to reach the second value that differs from the first value. Following the second segment, the third segment has the second constant value. The first and third segments have a sufficiently longer cycle than the minimum cycle of the M-sequence signal. In addition, the second segment is sufficiently shorter than the first and third segments.

The above conditions fall under the case of FIG. 9A(b1). The first segment refers to the segment (0, 100) in the temporal axis (the abscissa). The third segment refers to the segment (100, 200) in the temporal axis (the abscissa). The second segment refers to the signal-rising segment at the interface of (between) the first and third segments, and means the segment (substantially 100) in the temporal axis (the abscissa). In addition, the first value in FIG. 9A(b1) is about 0.5 in the current axis (the ordinate) and the second value in FIG. 9A(b1) is about 0.6.

Also, a signal (sequential data), which has an effect of increasing impedance precision of the M-sequence signal in a low-frequency range, is superimposed as illustrated in FIG. 9A(b1). At that time, the results of FIGS. 9A(c3), 9B(d3), 9B(e3), and 9B(f3) demonstrate that an effect of increasing impedance precision in a low-frequency range can be maintained while superimposing a monotonically increasing or decreasing signal, a sinusoidal wave with various amplitudes and frequencies, or a random rectangular wave in various combinations.

That is, when a signal as illustrated in FIG. 9A(b1) is applied to a complicated random signal like a driving signal for a real fuel cell vehicle and its output is analyzed, it is possible to accurately calculate impedance in a low-frequency range.

<<Input and Output Multiplied by Smooth Window Function>>

The following describes a process for reducing noise by multiplying sequential input and output data (an input current value and an output voltage value) by a smooth window function. Note that this process corresponds to step S406 of the flow chart for an impedance measurement processed by FFT processing in FIG. 4.

Figure 10:
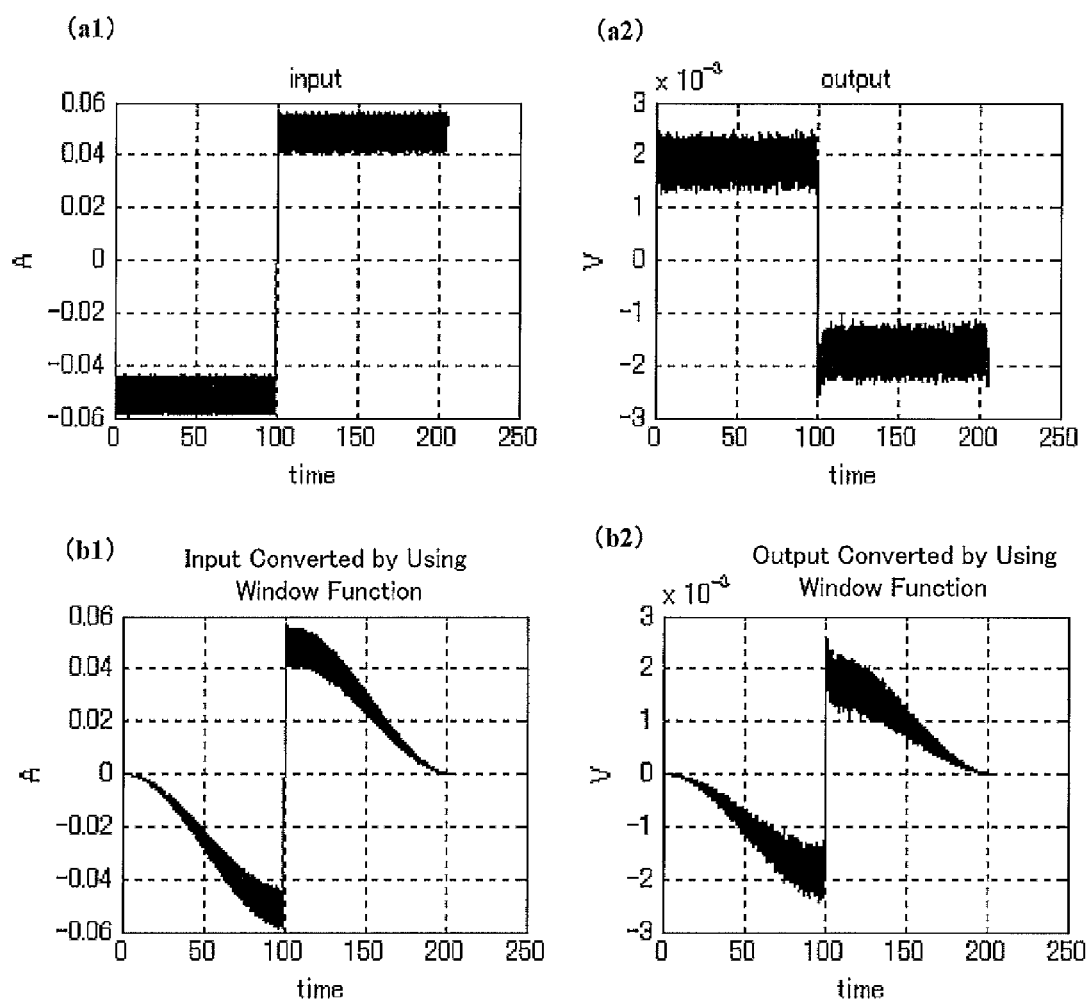
FIG. 10 is a characteristic diagram in which an M-sequence signal and a step signal are combined and the resulting sequential input and output data are then multiplied by a triangle window.

FIG. 10 is a characteristic diagram in which an M-sequence signal and a step signal are combined and the resulting sequential input and output data are then multiplied by a triangle window.

FIGS. 10(a1) and 10(a2) illustrate sequential data for an input current value and an output voltage value, respectively, after processing of step S405. The abscissa of FIGS. 10(a1) and 10(a2) represents a time and the ordinate represents an input current value (A) or an output voltage value (V), respectively.

In the segment (0 to 100) in the temporal axis of FIG. 10(a1), current finely fluctuates to have an average of −0.05 A. At the 100 in the temporal axis, a current value jumps to 0.05 A. Then, in the segment (100 to 200) in the temporal axis, a current finely fluctuates to have an average of 0.05 A.

At that time, the average of the segment (0 to 100) in the temporal axis and the average of the segment (100 to 200) in the temporal axis constitute a step-like superimposed signal. In addition, current components which finely fluctuate in the segments (0 to 100) and (100 to 200) in the temporal axis constitute an M-sequence signal. Also, FIG. 10(a2) shows a voltage waveform when the current of FIG. 10(a1) is made to pass through the fuel cell 13 (FIG. 3). FIG. 10(a1) illustrates an input current waveform. FIG. 10(a2) illustrates an output voltage waveform. Accordingly, their ordinates indicate different values. The output voltage waveform in FIG. 10(a2), however, reflects an influence of the superimposed step signal and a fluctuation of the M-sequence signal.

In addition, in FIGS. 10(b1) and 10(b2), each coefficient smoothly changes over time. The input current value (A) and the output voltage value (V) are each multiplied by a triangle window function whose coefficient change looks like a triangle over time. The same as for FIGS. 10(a1) and 10(a2) applies to the relationship between the ordinate and the abscissa.

At this occasion, at the 100 (time) in the temporal axis, a value containing the superimposed step signal and the M-sequence signal finely fluctuates in FIGS. 10(b1) and 10(b2). In contrast, the values at the 0 (time) and 200 (time) are about 0. Also, in the segment therebetween, the value containing the superimposed step signal and the M-sequence signal finely fluctuates and almost linearly, smoothly changes. This is because each of the data of FIGS. 10(a1) and 10(a2) is multiplied by a triangle window function to produce each characteristic diagram of FIGS. 10(b1) and 10(b2).

This technique can reduce occurrence of noise in high-frequency components.

Note that, a triangle window, Bartlett window, or flat top window is characterized in that intensity (coefficient) linearly increases or decreases in proportion to the number of samples. Thus, this results in an effect of improving impedance precision in a low-frequency range. A similar effect is observed for a flat top window.

In addition, a triangle window, Barthann window, Gauss window, Blackmanharris window, Taylor window, Parzen window, Hamming window, and rectangular window exert an effect of improving impedance precision in a high-frequency range equal to or higher than the minimum cycle of the M-sequence.

<<Regarding FFT>>

An input current having an M-sequence signal and the resulting output voltage of the fuel cell 13 has continuous, numerous (multiple) frequency responses. There exists data on intrinsic frequency characteristics. The data, however, remains heterogeneous in their time domain as data. That is, the data is not characteristic data as an input current and an output voltage that are changed depending on their frequency characteristics.

Thus, a fast Fourier transform (FFT) is performed to convert the data into frequency ranges, which produces input current and output voltage characteristics expressed by the frequency characteristics.

Note that this process corresponds to step S407 of the flow chart for an impedance measurement processed by FFT processing in FIG. 4.

<<Impedance Calculation Using FFT>>

The above FFT converts the signal into frequency ranges to yield the input current and output voltage characteristic data expressed by the frequency characteristics. Based on the data, impedance (i.e., voltage/current) expressed by the frequency characteristics is calculated.

Note that this process corresponds to step S408 of the flow chart for an impedance measurement processed by FFT processing in FIG. 4.

<<Impedance Multiplied by Rectangular Window Function>>

The following describes a rectangular window function. When impedance calculation needs only data on a low-frequency range, there is a process including: multiplying raw impedance data having no statistical processing by a rectangular window function which cuts a high-frequency range to zero (0); and cutting (deleting or reducing) noise components in a high-frequency range.

In this connection, a high-frequency range to be cut has a cut frequency at about half or less than the minimum cycle of the M-sequence. Alternatively, a frequency fluctuation amplitude is calculated along all the frequencies. Then, a fluctuation amplitude exceeding a predetermined value is going to be cut.

The following details a process for cutting noise in a high-frequency range, the process including: performing an FFT to transform and output impedance frequency characteristics (a resistance frequency characteristic and a reactance frequency characteristic); and multiplying the characteristics by a rectangular window function whose coefficients are composed of 1 and 0. Note that this process corresponds to step S409 of the flow chart for an impedance measurement processed by FFT processing in FIG. 4.

FIG. 11 illustrates how to cut noise at a high-frequency range by multiplying FFT-processed impedance frequency characteristic data (resistance frequency characteristics and reactance frequency characteristics) by a rectangular window function composed of coefficient 1 and coefficient 0. FIG. 11(a) illustrates a frequency characteristic of resistance. FIG. 11(b) illustrates a frequency characteristic of reactance.

In FIG. 11, FIG. 11(a) is a graph illustrating a resistance frequency characteristic. The abscissa thereof represents a frequency (Hz). The ordinate thereof represents a resistance level [Ω]. In addition, FIG. 11(b) is a graph illustrating a reactance frequency characteristic. The abscissa thereof represents a frequency (Hz). The ordinate thereof represents a resistance level [Ω].

Note that the real and imaginary parts of the impedance correspond to resistance and reactance, respectively.

In FIGS. 11(a) and 11(b), data on both the resistance and the reactance vary in a high-frequency range, and have a large variation width. These graphs depict a state in which high-frequency noise is observed. This phenomenon always occurs in a real device. Consequently, if nothing is done, impedance calculation results in markedly more errors, which are impractical.

In FIGS. 11(a) and 11(b), the characteristic line of a rectangular window function 510 includes a characteristic line 511 and a characteristic line 512 for representation. Specifically, the rectangular window function 510 has coefficient 1 in a range less than 5 Hz (i.e., the characteristic line 511) and coefficient 0 in a range equal to or higher than 5 Hz (i.e., the characteristic line 512). In addition, the function exhibits a characteristic that its coefficient jumps from 1 to 0 at 5 Hz.

Note that in FIGS. 11(a) and 11(b), the rectangular window function 510 is superimposed on each of the resistance characteristic and the reactance characteristic for clearer representation. Thus, the coefficients 1 and 0 of the rectangular window function 510 disagree with the values for the resistance and the reactance in the ordinate.

Since the multiplier coefficient is either 1 or 0, the resulting resistance and reactance values are either as they are or 0. Hence, this way of representation in FIGS. 11(a) and 11(b) can be sufficiently understood.

In this connection, if the original resistance and reactance are each multiplied by this rectangular window function 510, all the high-frequency components are deleted. Accordingly, their noise components are also deleted or reduced.

Note that a cut frequency of 5 Hz for the rectangular window function corresponds to half the minimum cycle (10 Hz) of the M-sequence signal.

Figure 12A:
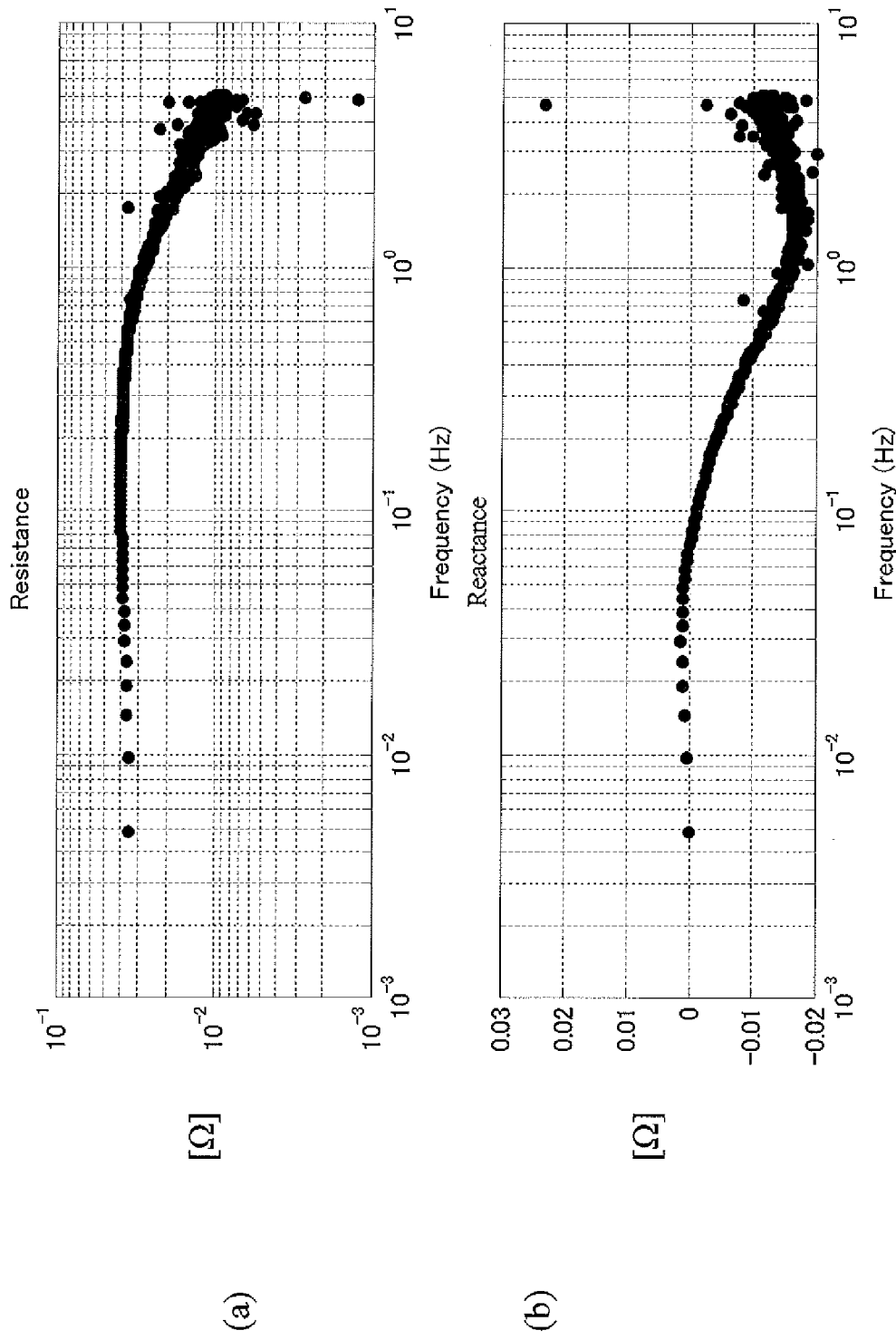
FIG. 12A is impedance characteristic diagrams after application of a rectangular window function.

In addition, FIG. 12A illustrates resistance and reactance data multiplied by the rectangular window function 510.

FIG. 12A is impedance (resistance and reactance) characteristic diagrams after application of the rectangular window function 510 (FIG. 11). FIG. 12A(a) is a resistance characteristic diagram. FIG. 12A(b) is a reactance characteristic diagram.

Since the high-frequency components of the impedance (resistance and reactance) characteristics are deleted as illustrated in FIGS. 11(a) and 11(b), the resulting impedance (resistance and reactance) characteristics become stable. Note that a scale of each ordinate in FIGS. 12A(a) and 12A(b) is smaller in several orders of magnitude than that of each ordinate in FIGS. 11(a) and 11(b). This is because a marked decrease in noise makes it possible to express data with increased precision.

In addition, since the rectangular window function 510 whose cut frequency is 5 Hz is applied in FIGS. 11(a) and 11(b), data on frequencies up to approximately 5 Hz is designated in each abscissa of FIGS. 12A(a) and 12A(b). Because of their high precision, insertion of characteristics in a frequency range at 5 Hz or higher allows for their additional characteristic estimation.

<<Statistical Processing of Data>>

The following describes a process for increasing precision by statistically processing impedance data as calculated in step S408 (FIG. 4). Note that this process for statistically processing impedance data corresponds to step S409 of the flow chart for an impedance measurement processed by FFT processing in FIG. 4.

First, the <Overview of Statistical Processing> is described. Next, the <Details of Statistical Processing> is illustrated.

<Overview of Statistical Processing>

Statistical processing of impedance data is not performed at once in all the frequency ranges. A certain predetermined segment (a frequency range) is determined, and then the statistical processing is carried out within this segment as a unit. After that, this predetermined segment is moved in sequence from a low-frequency range to a high-frequency range. Finally, the statistical processing is completed in all the frequency ranges of interest.

<Details of Statistical Processing>

First, for each of a high-frequency side and a low-frequency side beside a predetermined segment subjected to statistical processing, the predetermined number of measurement subjects is set.

Next, data with the above predetermined number of measurement subjects are used to calculate a median of each of resistance and reactance within the preset segment (frequency range).

At that time, the statistical processing may be performed in only the high-frequency side or in only the low-frequency side.

Note that examples of the method for statistical processing include a variety of methods such as an "average". When there is a significant deviation in data, however, a "median" is better suited than the "average" to produce practical results of the statistical processing.

In addition, impedance (Imp) is calculated from resistance (Rr) and reactance (Ri) as follows:

$$Imp = Rr + Ri \times i,$$

where i represents an imaginary number.

Then, the segment (frequency range) subjected to the statistical processing is sequentially moved. While moving, that segment is subjected to a process for calculating the above median (i.e., median processing). In this regard, however, the number of data used for the statistical processing is selected so as to increase the number of data in the high-frequency side while moving the segment subjected to the statistical processing from the low-frequency side to the high-frequency side.

That is, the frequency range of the data used for the statistical processing is selected so as to broaden the frequency range in a high-frequency range. In this regard, however, a frequency interval of the data usually remains constant. Accordingly, when its process output is obtained on a log scale, its process time increases in the high-frequency range.

Specifically, when process data with a 1-Hz interval is present, there are 90 data in a frequency range from 10 Hz to 100 Hz. In addition, there are 900 data in a frequency range from 100 Hz to 1 kHz. Consequently, an enormous volume of the process data accumulates in the high-frequency range, so that its process time significantly increases.

To avoid this phenomenon, the statistical processing in a high-frequency range is not performed at every 1 Hz. Instead, the statistical processing with, for example, a 10-Hz interval should be carried out. This reduces the number of the process data and thus shortens the process time.

Note that even if the interval for the statistical processing is extended, the number of data handled by each processing and its frequency range are the same as those of the case of processing at every 1 Hz. Hence, the precision of the processing results is not decreased. The interval to obtain the processing results just becomes longer in a frequency axis.

In addition, the above median is calculated while moving the segment (frequency range) subjected to the statistical processing. Accordingly, the above median is also referred to as a moving median value (i.e., a moving median, a moving value for statistical processing).

Note that in statistical processing for resistance and reactance, the number of data used for each statistical processing may vary. In addition, a process for increasing the number of data with increasing frequency may also vary.

Further, in the statistical processing for the resistance and the reactance, a process for increasing a frequency range of data used for each statistical processing with increasing frequency may also vary.

Furthermore, in the statistical processing for the resistance and the reactance, an interval for each statistical processing may be extended with increasing frequency.

Moreover, in the statistical processing for the resistance and the reactance, an interval for each statistical processing data may be extended as the data on each statistical processing is obtained at a higher frequency than one or more predetermined frequencies.

Additionally, the moving median value (moving value for statistical processing) of the resistance as calculated using the above statistical processing may be forced to be monotonically decreased or may remain constant as the processing moves from a low-frequency range to a high-frequency range within the frequency range higher than the minimum cycle of the M-sequence.

That is, the resistance of the frequency segment A which has been subjected to the statistical processing is compared with that of the segment (A+1) which is located adjacent to the high frequency side of the segment A. When the resistance (A+1), which is a moving median value for resistance within the segment (A+1), is larger than the resistance (A), which is a moving median value for resistance within the segment (A), the value of the resistance (A) is employed as a value of the resistance (A+1).

In addition, the moving median value (moving value for statistical processing) for reactance may increase or decrease as the range moves from a low frequency to a high frequency. In this regard, however, a rate (variation rate) limitation (variation proportion limitation) may be provided regarding a vertical variation (increase or decrease).

At that case, when the reactance (A+1), which is a moving median value for reactance within the segment (A+1), is larger than the reactance (A)+ΔA, the reactance (A)+ΔA is employed as a value for the reactance (A+1).

In addition, when the reactance (A+1) is smaller than the reactance (A)−ΔA, the reactance (A)−ΔA is employed as a value for the reactance (A+1).

Note that the ΔA is a difference between the reactance (A+1) and the reactance (A).

The above describes statistical data processing. During this statistical data processing, when the variation in impedance at a low-frequency range is equal to or larger than a predetermined value, for example 1 to 5 [mΩ], the minimum cycle of the M-sequence signal is made longer or the number of the M-sequences is increased. This makes it possible to reduce the variation in impedance at a low-frequency range.

Also, when $m_0$ is an integer of 1 or more, the length (information volume) of the M-sequence signal can be designated as $2^{m_0}-1$.

<<Bode Diagram>>

The following illustrates how to draw a Bode diagram of impedance. Note that the process for drawing a Bode diagram of impedance corresponds to step S410 of the flow chart for an impedance measurement processed by FFT processing in FIG. 4.

After processes go through step S409 in FIG. 4, frequency characteristics of impedance are obtained. Then, gain and phase information on impedance can be used to draw each of a Bode diagram illustrating a relationship between its frequency and gain and a Bode diagram illustrating a relationship between its frequency and phase.

Figure 12B:
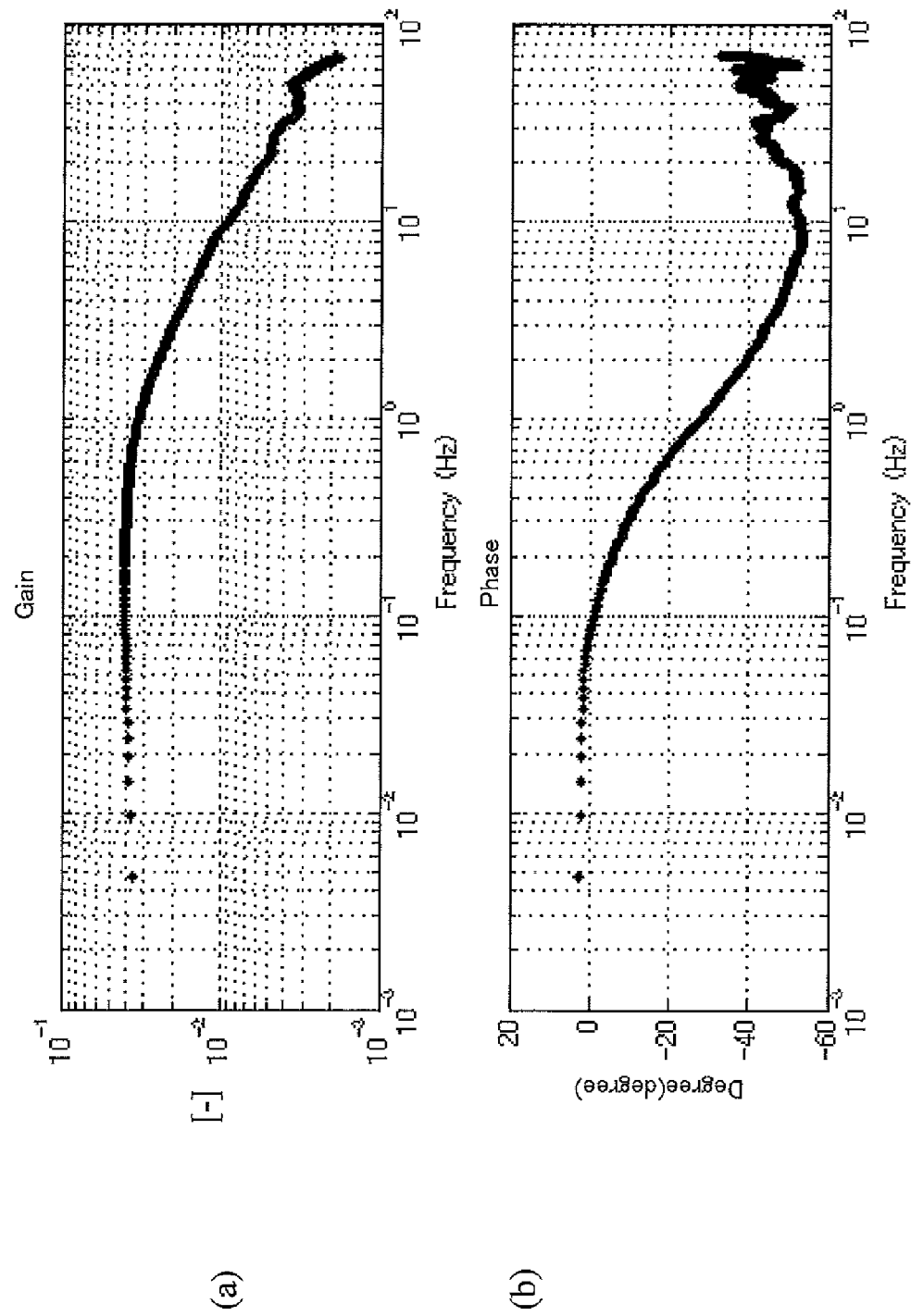
FIG. 12B is Bode diagrams illustrating an impedance characteristic after application of statistical processing.

FIG. 12B is Bode diagrams illustrating an impedance characteristic after application of statistical processing. FIG. 12B (a) is an exemplary Bode diagram which shows a gain. FIG. 12B(b) is an exemplary Bode diagram which shows a phase. The statistical processing of step S409 markedly reduces an influence of noise.

In addition, each abscissa of FIGS. 12B(a) and 12B(b) represents a frequency (Hz). The ordinate of FIG. 12B(a) represents a gain [-]. The ordinate of FIG. 12B(b) represents a degree. Note that since the gain has no dimension, the gain is denoted as [-].

Also, the monitor-image control unit 309 illustrated in FIG. 3 can display the Bode diagrams.

<<Cole-Cole Plot>>

The following illustrates how to draw a Cole-Cole plot of impedance. Note that the process for drawing a Cole-Cole plot of impedance corresponds to step S411 of the flow chart for an impedance measurement processed by FFT processing in FIG. 4.

After processes go through step S409 in FIG. 4, frequency characteristics of impedance are obtained. Then, resistance and reactance components of the impedance can be used to draw a Cole-Cole plot.

Figure 13:
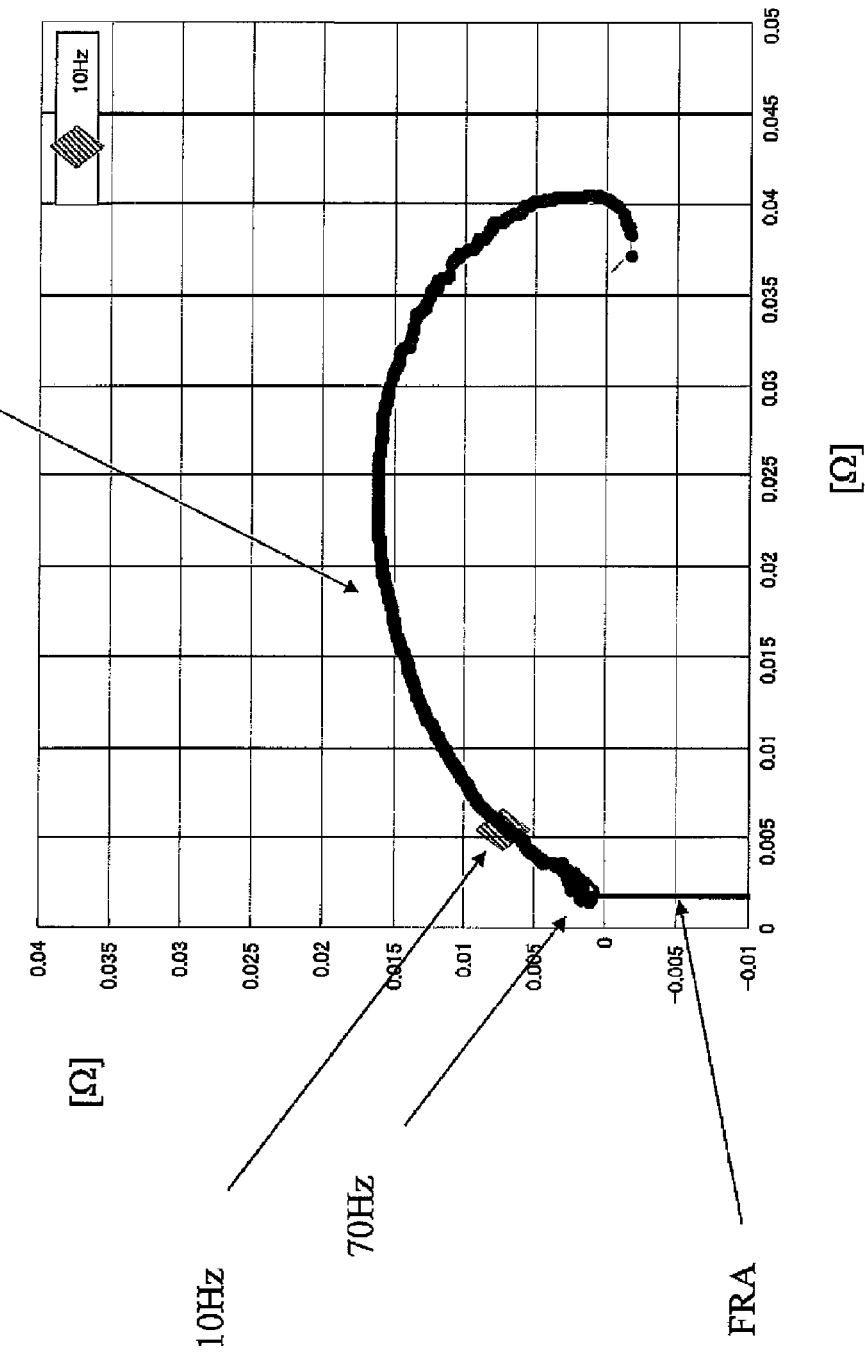
FIG. 13 is an exemplary Cole-Cole plot which is drawn based on an impedance characteristic.

FIG. 13 is an exemplary Cole-Cole plot which is drawn based on the impedance (resistance and reactance) characteristics illustrated in FIGS. 12A(a) and 12A(b). The abscissa in FIG. 13 represents a resistance level. The ordinate represents a reactance level.

In addition, the monitor-image control unit 309 illustrated in FIG. 3 can display the Cole-Cole plot.

The Cole-Cole plot in FIG. 13 is a result of calculation as obtained by performing all the processes from step S401 to step S408 and the statistical processing of step S409 in FIG. 4. Also, for comparison, an equivalent circuit is used to identify impedance which has been calculated using a FRA method. This result is denoted by an arrow (FRA). Note that a characteristic line showing data at 70 Hz or less has a positive value as the FRA reactance value in FIG. 13. This portion substantially overlaps with the characteristic line pointed out by an arrow (PRESENT METHOD) according to a method of an embodiment of the present invention.

When the FRA method was used, its measurement time required about 20 minutes or longer. In contrast, the present method took a measurement time of 3 minutes 25 seconds, and was able to calculate the impedance in almost the same degree as in the FRA method.

When the calculation results (FIG. 9A(b3)) as obtained by a process for multiplying data by a rectangular window function according to step S409 are compared with those of the present method (the statistical processing of step S409), their results are substantially similar in an extremely low-frequency range. In a frequency range other than the above range, the present method is by far superior in view of variation of the calculation data.

In addition, in the case of the rectangular window function, the process can calculate impedance only up to 5 Hz, which is half the minimum cycle (10 Hz) of the M-sequence. The present method, however, can calculate almost correct impedance up to 70 Hz, which is seven times the minimum cycle (10 Hz) of the M-sequence.

(Other Embodiments: Method for Sequentially Measuring Impedance•Sequential Impedance Measurement Device)

The following describes other embodiments of a method for sequentially measuring impedance and a sequential impedance measurement device.

First, the following illustrates an embodiment that is not described in the flow chat for an impedance measurement processed by FFT processing in FIG. 4.

<<Continuous Application of M-sequence Signal and Impedance Calculation at Any Timing>>

A process is disclosed, including: continuously applying an M-sequence signal containing M-sequence data; accumulating data; and calculating the data at any timing.

FIG. 14A is an exemplary time chart illustrating a relationship between impedance calculation and its image display when an M-sequence signal is continuously applied.

In FIG. 14A, the abscissa represents a time flow. In addition, the items "DATA USED FOR IMP CALCULATION", "START IMP CALCULATION", "END IMP CALCULATION AND DISPLAY" are designated. Note that for convenience of representation in FIG. 14A, impedance is abbreviated as "IMP".

In the device configuration for an impedance measurement processed by FFT processing as illustrated in FIG. 3, the M-sequence signal is continuously applied to the fuel cell 13. At that time, the analyzing unit 306 receives data necessary for impedance calculation (an input current value and an output voltage value).

The "DATA USED FOR IMPEDANCE CALCULATION" in FIG. 14A indicates a condition under which data necessary for impedance calculation are continuously input.

The analyzing unit (analyzer) 306 (FIG. 3) starts calculating, at or near the timing denoted by the symbol 602, impedance of the data input from the timing denoted by the symbol 600 to the timing denoted by the symbol 601. Then, the impedance calculation is completed at the timing denoted by the symbol 603. After that, the monitor-image control unit (controller) 309 (FIG. 3) displays the results. The analyzing unit 306 calculates the data in a short period, so that a period between the timings denoted by the symbols 601 and 603 is short enough for a period required for inputting the data used for impedance calculation.

At the timing denoted by the symbol 620, which timing is partway through from the timing denoted by the symbol 611 to the timing denoted by the symbol 621, an environment (a driving condition of a vehicle) involving the fuel cell 13 changes. Then, at the timing denoted by the symbol 621, data which involves a new condition and is used for impedance calculation is input.

Subsequently, at the timing denoted by the symbol 622, the analyzing unit 306 starts calculating impedance for the new condition. At the timing denoted by the symbol 623, the impedance calculation involving the new condition is completed. Then, the monitor-image control unit 309 displays the results. Meanwhile, the monitor-image control unit 309 displays a different result between the timings denoted by the symbols 613 and 623.

At the timing denoted by the symbol 631, the data which involves the new condition and is used for impedance calculation is input. Then, impedance calculation starts at the timing denoted by the symbol 632. After that, the impedance calculation involving the new steady condition is completed at the timing denoted by the symbol 633 to display the results on the monitor-image control unit 309. Thus, at the timing denoted by the symbol 633, the display completely reflects the new condition.

In view of the above, compared with a period required for inputting data used for impedance calculation (i.e., one pattern for an M-sequence signal is completed), an impedance calculation time that the analyzing unit 306 uses is short enough. Accordingly, its recalculation is possible. Of note is that when data is calculated amid an M-sequence signal pattern, a peak error involving an autocorrelation of the M-sequence signal occurs. The data should thus be recalculated per M-sequence pattern. As described above, in the above embodiment of the present application, the impedance calculation time that the analyzing unit 306 uses is short enough to be able to recalculate the data. This makes it possible to keep sufficient precision.

FIG. 14B is an exemplary time chart illustrating how to shorten an impedance calculation time.

In FIG. 14B, after a predetermined M-sequence pattern is completed, impedance is calculated based on the predetermined M-sequence pattern. As to what follows an M-sequence that has been input, the same "predetermined M-sequence pattern" is not input again. Instead, only the "segment 14b1" of the M-sequence pattern is input. Then, impedance is calculated based on the "PATTERN SUBJECTED TO CALCULATION" illustrated in FIG. 14B.

The "PATTERN SUBJECTED TO CALCULATION" includes the "segment 14b1" and the "segment 14b2" (i.e., a synthetic pattern). The next "predetermined M-sequence pattern" has the same elements but is inverted in their orientation. This configuration allows for an accurate impedance calculation without an influence of an autocorrelation function error generated when impedance is calculated partway through completion of the predetermined M-sequence signal. In addition, the above configuration makes it possible to shorten an impedance calculation interval by an amount of time used for the "segment 14b2".

Further, when the M-sequence signal is continuously applied, a fluctuation amplitude of an input value may vary. With regard to a water content measured in a high-frequency range, the measurement takes a relatively short period. Accordingly, the water content can be calculated within a predetermined error range even if the calculation is performed independent of the fluctuation amplitude of the input value.

Moreover, when impedance is calculated in a low-frequency range, the fluctuation amplitude of the input value may change and exceed a predetermined value. At that time, the non-linearity of the measurement subject is taken into consideration, and an available range within the frequency range of the measured value is to be restricted.

<<Continuous Application of M-Sequence Signal•Different M-Sequences>>

FIG. 14 illustrates an example that the same M-sequence signal is continuously applied. The examples, however, include a process for continuously applying different M-sequences. Continuous application of different M-sequences enables M-sequences having a broader frequency to be applied. This makes it possible to calculate impedance with predetermined precision in a broader frequency range.

Note that although the above describes a process for continuously applying different M-sequences, the process is not necessarily continuous. That is, there is a process that the different M-sequences may be independently applied. In this case, impedance with predetermined precision can be calculated in a broad frequency range compared with the case of applying the same M-sequence signal.

<<Other White Signals>>

Hereinabove, the application of the M-sequence signal is described. The reason why the M-sequence signal is applied is that the M-sequence signal has numerous frequency components and is thus selected as a signal with a white power spectrum. Hence, instead of using the M-sequence signal, another white signal may be used.

<<First and Second Power Indication Values>>

In addition, in the first embodiment illustrated in FIG. 1 and the second embodiment illustrated in FIG. 2, the control processor 12 outputs the power indication value 12S. This power indication value 12S is sent to both the first signal-adding unit, which transmits the fuel cell command signal 103S to the fuel cell 13, and the second signal-adding unit 104, which transmits the battery command signal 104S to the battery 14. But, two kinds of the power indication value may be used.

That is, the control processor 12 outputs the first power indication value for the fuel cell and the second power indication value for the battery. This first power indication value is applied to the first signal-adding unit 103, and the second power indication value is applied to the second signal-adding unit 104.

In such a manner, the power indication value for the fuel cell and the power indication value for the battery are independently sent out. This configuration makes it possible to more properly control the fuel cell and the battery depending on property differences therebetween.

<<Window Functions>>

In order to increase low-frequency range precision, FIG. 10 illustrates the case of multiplying the sequential input and output data (an input current value and an output voltage value) by a window function such as a flat top window and a triangle window (Bartlett window), which is characterized in that an intensity increase or decrease is lineally proportional to the number of samples. In addition, in order to increase high-frequency range precision, discussed is the case of multiplying the data by a triangle window, Barthann window, Gauss window, Blackmanharris window, Taylor window, Parzen window, Hamming window, or a rectangular window. As described as a window function, a smooth window function is effective in reducing noise. Thus, window functions are not limited to the above-listed examples.

Other window functions that can be used include Hann window, Blackman window, Kaiser window, Bartlett-Hann window, and the like.

<<Rectangular Window Function>>

FIG. 11 illustrates a rectangular window function 510 in which a predetermined frequency is used as a transition to separately multiply data by coefficient 1 or coefficient 0. Examples, however, are not limited to the rectangular window function having low-frequency and high-frequency ranges separated in such a manner.

If noise is distributed in a particular portion, that noise portion may be multiplied by coefficient 0 and the rest may be multiplied by coefficient 1. This type of the rectangular window function may be used.

In addition, a power spectrum of noise is determined. When the noise is substantially white, a sample frequency is increased to sufficiently higher than the minimum cycle of the M-sequence. The predetermined frequency illustrated in FIG. 11 is used as a transition to multiply the data by coefficient 1 or 0. This rectangular window function 510 is used to cut high-frequency components. Then, a power spectrum of noise is determined. When the noise overlaps with a narrow frequency range equal to or lower than the minimum cycle of the M-sequence, a rectangular window function is used to multiply this narrow frequency range by coefficient 0. In this fashion, depending on the power spectrum of noise, a rectangular window function may be selected.

<<Statistical Processing>>

Regarding the statistical processing of step S409 of the flow chat for an impedance measurement processed by FFT processing in FIG. 4, the case of using a median is described. The processing, however, does not necessarily mean the median processing. Examples of the effective processing include statistical processing using an average or mode and processing using a fitting value in a probability distribution function such as a normal distribution, and a maximum likelihood estimate.

<<Configuration of Sequential Impedance Measurement Device>>

In addition, the sequential impedance measurement devices 101 and 201 illustrated in FIGS. 1 and 2 may include the monitor-image control unit 309 illustrated in FIG. 3.

Also, the FFT impedance-measuring-signal-generating unit may include the signal-inverting unit 105 as illustrated in FIGS. 1 and 2.

<<Store Parameter Influence as Map Data>>

Also, impedance of a fuel cell is predetermined and calculated when a steady state and an unsteady state are assumed. The calculation results are stored together with parameters in map means as a map. When the analysis results and/or parameters are beyond the scope of assumption at a real measurement, the above map may be used (read).

In addition, when the above map is created by determining data under conditions of a temperature, pressure, and relative humidity different from those of the existing data in the real measurement, it is possible to add a parameter influence under those conditions as map data.

Data accumulated in the map by using such a learning function is available as a correction value for an unidentified situation.

Note that the monitor-image control unit 309 illustrate din FIG. 3 may include the map means.

<<Other Measurement Methods Using Sequential Impedance Measurement Device>>

In addition, the sequential impedance measurement device illustrated in FIG. 3 determines impedance as follows. First, a current change is applied to a fuel cell. Next, the resulting output voltage change of the fuel cell is obtained. Then, the analyzing unit 306 uses these current and voltage changes for its analysis and calculation. Finally, impedance is calculated and determined.

However, there is an alternative measurement method including: applying a voltage change to a fuel cell; obtaining the resulting output current change of the fuel cell; analyzing and calculating the voltage and current changes by the analyzing unit 306; and calculating and determining impedance.

Note that the above description details a sequential impedance measurement device and a method for sequentially measuring impedance. The above description, however, doubles as the description of a fuel cell system.

(Supplementary Information on Present Invention and Embodiments)

<As to Method for Using M-Sequence Signal and FFT Calculation>

As described above, in an impedance measurement of fuel cell by using the conventional FRA method, impedance is determined using a sinusoidal wave at a single frequency. Then, the frequency is changed, and the same impedance measurement is repeated in all the necessary frequency bands. Thus, the FRA method requires a considerable amount of time, so that a change in a transient impedance characteristic in a short time phenomenon cannot be determined.

An embodiment of the present invention provides a method for calculating impedance, the method including: applying an M-sequence signal to an input current of a fuel cell; measuring sequential data on an input current value and an output voltage value; subjecting these data to FFT processing; and calculating impedance from results of the FFT processing of the input and output values. The M-sequence signal has a white power spectrum. Application of the M-sequence signal to the input current of the fuel cell means that the signals with continuous, numerous (multiple) frequencies are applied. Thus, this method is equivalent to performing, at once, measurements that are repeated in the conventional FRA method. Consequently, the measurement according to this embodiment can be carried out in a remarkably short time.

In this regard, although the method according to this embodiment applies a signal with continuous, numerous (multiple) frequencies, its data remains heterogeneous about numerous (multiple) frequency characteristics in its time domain. This makes it impossible to obtain characteristic data as impedance data that changes according to the frequency characteristics.

Accordingly, a fast Fourier transform (FFT) algorithm, for example, is used to convert the data into frequency ranges. This transform can produce impedance data that is expressed by the frequency characteristics. The method (M-sequence signal) for applying a signal with various frequencies at once and the FFT algorithm are used to determine the fuel cell impedance within a broad frequency band in a remarkably short time. Consequently, this method allows for a sequential impedance measurement and can therefore determine an impedance change in a short time phenomenon.

In addition, in an embodiment of the present invention, a method for applying a superimposed signal and a method for multiplying data by a window function can be adopted. This embodiment makes it possible to determine impedance with much higher precision.

What is claimed is:

1. A sequential impedance measurement device in which impedance of a fuel cell is sequentially measured in a control system, the control system using a power indication value or a current indication value to control the fuel cell and a battery, the values being calculated by a control processor based on a load output value and an output indication value for a fuel cell system, the fuel cell system including the fuel cell and the battery and supplying power to a load, the device comprising:

an M-sequence-signal-generating section which generates a binary or multi-valued M-sequence signal with a white power spectrum;

a superimposed-signal-generating section which generates a superimposed signal superimposed on the M-sequence signal;

a signal-processing section which combines the M-sequence signal and the superimposed signal or which separately outputs the M-sequence signal or the superimposed signal;

a first signal-adding unit which superimposes and applies a signal output from the signal-processing section on the power indication value or the current indication value, the values being sent by the control processor;

a second signal-adding unit which superimposes and applies a signal inverted from the signal output from the signal-processing section on the power indication value or the current indication value, the values being sent by the control processor;

a current and voltage measuring unit which measures and incorporates a current and a voltage of the fuel cell, the fuel cell being controlled by a signal generated by the first signal-adding unit; and an impedance calculator which calculates the impedance of the fuel cell, the calculation based on values of the current and the voltage as measured by the current and voltage measuring unit, wherein a signal after the application in the second signal-adding unit is output to control the battery; and a calculation result of the impedance calculator is output as a measured result.

2. The device according to claim 1, further comprising: a second current and voltage measuring unit which measures and incorporates a current and a voltage of the battery, the battery being controlled by the signal after the application in the second signal-adding unit, wherein the impedance calculator receives the values of the current and the voltage measured by the current and voltage measuring unit and values of the current and the voltage as measured by the second current and voltage measuring unit; and the impedance of the fuel cell and impedance of the battery are calculated to output a result of the calculation.

3. The device according to claim 1, wherein the superimposed signal of the superimposed-signal-generating section contains predetermined sequential data;

a first segment of the sequential data has a first value which remains constant;

a second segment following the first segment has a value increased or decreased from the first value to reach a second value different from the first value;

a third segment following the second segment has the second value which remains constant; and the first and third segments are sufficiently longer than a minimum cycle of an M-sequence in the M-sequence signal; and the second segment is sufficiently shorter than the first and third segments.

4. The device according to claim 3, wherein the sequential data of the superimposed signal is data containing a step signal.

5. The device according to claim 4, wherein data containing an additional predetermined wave form is superimposed on the data containing a step signal to increase precision in a measurement of impedance in a frequency range including a low-frequency range.

6. The device according to claim 1, wherein the device uses a data sampling cycle of the current and voltage measuring unit during a sequential measurement of the impedance of the fuel cell, the data sampling cycle being about 20times or higher than a minimum cycle of an M-sequence in the M-sequence signal to increase impedance measurement precision in a frequency range higher than the minimum cycle of the M-sequence.

7. The device according to claim 1, wherein the device uses a data sampling cycle of the current and voltage measuring unit during a sequential measurement of the impedance of the fuel cell,
wherein when the data sampling cycle is about 100 times or higher than a minimum cycle of an M-sequence in the M-sequence signal to perform sampling, resulting data is subjected to statistical processing; the data is sent to the impedance calculator at a cycle about 20 times or higher than the minimum cycle of the M-sequence;
and the impedance calculator calculates the impedance by using the data to increase impedance measurement precision in a frequency range higher than the minimum cycle of the M-sequence.

8. A fuel cell system which includes a fuel cell and a battery and supplies power to a load, and in which the fuel cell and the battery is controlled by using a power indication value or a current indication value, the values being calculated by a control processor based on a load output value and an output indication value sent to the fuel cell, the fuel cell system comprising an sequential impedance measurement device comprising:
an M-sequence-signal-generating section which generates a binary or multi-valued M-sequence signal with a white power spectrum;
a superimposed-signal-generating section which generates a superimposed signal superimposed on the M-sequence signal;
a signal-processing section which combines the M-sequence signal and the superimposed signal or which separately outputs the M-sequence signal or the superimposed signal;
a first signal-adding unit which superimposes and applies a signal output from the signal-processing section on the power indication value or the current indication value, the values being sent by the control processor;
a second signal-adding unit which superimposes and applies a signal inverted from the signal output from the signal-processing section on the power indication value or the current indication value, the values being sent by the control processor;
a current and voltage measuring unit which measures and incorporates a current and a voltage of the fuel cell, the fuel cell being controlled by a signal generated by the first signal-adding unit; and an impedance calculator which calculates the impedance of the fuel cell, the calculation based on values of the current and the voltage as measured by the current and voltage measuring unit,
wherein a signal after the application in the second signal-adding unit is output to control the battery; and a method for controlling the fuel cell and the battery by the control processor is modified according to a calculation result of the impedance calculator.

9. The system according to claim 8, wherein the sequential impedance measurement device further comprises a second current and voltage measuring unit which measures and incorporates a current and a voltage of the battery controlled by the signal from the second signal-adding unit, and
wherein the impedance calculator receives the values of the current and the voltage measured by the current and voltage measuring unit and values of the current and the voltage measured by the second current and voltage measuring unit; the impedance of the fuel cell and impedance of the battery are calculated; and a method for controlling the fuel cell and the battery by the control processor is modified by a result of the calculation.

10. The system according to claim 8, wherein the sequential impedance measurement device further comprises a monitor-image control unit which modifies and displays the result of the calculation by the impedance calculator.

11. The system according to claim 8, wherein the superimposed signal of the superimposed-signal-generating section contains predetermined sequential data;
a first segment of the sequential data has a first value which remains constant;
a second segment following the first segment has a value increased or decreased from the first value to reach a second value different from the first value;
a third segment following the second segment has the second value which remains constant; and
the first and third segments are sufficiently longer than a minimum cycle of an M-sequence in the M-sequence signal; and
the second segment is sufficiently shorter than the first and third segments.

12. The system according to claim 11, wherein the sequential data of the superimposed signal is data containing a step signal.

13. The system according to claim 8, wherein the system uses a data sampling cycle of the current and voltage measuring unit during a sequential measurement of the impedance of the fuel cell, the data sampling cycle being about 20 times or higher than a minimum cycle of an M-sequence in the M-sequence signal to increase impedance measurement precision in a frequency range higher than the minimum cycle of the M-sequence.

14. The system according to claim 8, wherein the system uses a data sampling cycle of the current and voltage measuring unit during a sequential measurement of the impedance of the fuel cell,
wherein when the data sampling cycle is about 100 times or higher than a minimum cycle of an M-sequence in the M-sequence signal to perform sampling, resulting data is subjected to statistical processing; the data is sent to the impedance calculator at a cycle about 20 times or higher than the minimum cycle of the M-sequence;
and the impedance calculator calculates the impedance by using the data to increase impedance measurement precision in a frequency range higher than the minimum cycle of the M-sequence.

* * * * *